(12) United States Patent
Forrest et al.

(10) Patent No.: US 8,415,757 B2
(45) Date of Patent: Apr. 9, 2013

(54) ORGANIC HYBRID PLANAR-NANOCRYSTALLINE BULK HETEROJUNCTIONS

(75) Inventors: Stephen R. Forrest, Ann Arbor, MI (US); Fan Yang, Piscataway, NJ (US)

(73) Assignees: The Trustees of Princeton University, Princeton, NJ (US); The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/011,255

(22) Filed: Jan. 21, 2011

(65) Prior Publication Data

US 2011/0204416 A1     Aug. 25, 2011

Related U.S. Application Data

(62) Division of application No. 11/561,448, filed on Nov. 20, 2006, now Pat. No. 7,897,429.

(51) Int. Cl.
*H01L 27/14*     (2006.01)

(52) U.S. Cl.
USPC ............... 257/431; 257/40; 257/E51.001

(58) Field of Classification Search .................. 257/40, 257/431, E51.001
See application file for complete search history.

(56) References Cited

U.S. PATENT DOCUMENTS

| | | | |
|---|---|---|---|
| 4,105,470 A | 8/1978 | Skotheim | |
| 4,190,950 A | 3/1980 | Skotheim | |
| 6,084,176 A | 7/2000 | Shiratsuchi et al. | |
| 6,274,806 B1 | 8/2001 | Sugihara et al. | |
| 6,278,056 B1 | 8/2001 | Sugihara et al. | |
| 6,333,458 B1 | 12/2001 | Forrest et al. | |
| 6,352,777 B1 | 3/2002 | Bulovic et al. | |
| 6,420,031 B1 | 7/2002 | Parthasarathy et al. | |
| 6,440,769 B2 | 8/2002 | Peumans et al. | |
| 6,451,415 B1 | 9/2002 | Forrest et al. | |
| 6,479,745 B2 | 11/2002 | Yamanaka et al. | |
| 6,580,027 B2 | 6/2003 | Forrest et al. | |
| 6,639,073 B2 | 10/2003 | Islam et al. | |
| 6,657,378 B2 | 12/2003 | Forrest et al. | |
| 6,756,537 B2 | 6/2004 | Kang et al. | |

(Continued)

OTHER PUBLICATIONS

Peumans P. et al. 2000. American Institute of Physics, "Efficient photon harvesting at high optical intensities in ultrathin organic double-heterostructure photovoltaic diodes". Applied Physics Letters, vol. 76, No. 19, May 8, 2000, pos. 2650-2652.

(Continued)

*Primary Examiner* — Anthony Ho
(74) *Attorney, Agent, or Firm* — Finnegan, Henderson, Farabow, Garrett & Dunner LLP

(57) ABSTRACT

A photosensitive optoelectronic device having an improved hybrid planar bulk heterojunction includes a plurality of photoconductive materials disposed between the anode and the cathode. The photoconductive materials include a first continuous layer of donor material and a second continuous layer of acceptor material. A first network of donor material or materials extends from the first continuous layer toward the second continuous layer, providing continuous pathways for conduction of holes to the first continuous layer. A second network of acceptor material or materials extends from the second continuous layer toward the first continuous layer, providing continuous pathways for conduction of electrons to the second continuous layer. The first network and the second network are interlaced with each other. At least one other photoconductive material is interspersed between the interlaced networks. This other photoconductive material or materials has an absorption spectra different from the donor and acceptor materials.

18 Claims, 17 Drawing Sheets

U.S. PATENT DOCUMENTS

| | | | |
|---|---|---|---|
| 7,118,936 | B2 | 10/2006 | Kobayashi et al. |
| 2004/0048000 | A1 | 3/2004 | Shtein et al. |
| 2004/0226602 | A1 | 11/2004 | Durr et al. |
| 2004/0251508 | A1 | 12/2004 | Tomita |
| 2005/0061364 | A1 | 3/2005 | Peumans et al. |
| 2005/0110007 | A1 | 5/2005 | Forrest et al. |
| 2005/0166959 | A1 | 8/2005 | Lee et al. |
| 2005/0266218 | A1 | 12/2005 | Peumans et al. |
| 2006/0027802 | A1 | 2/2006 | Forrest et al. |
| 2006/0032529 | A1 | 2/2006 | Rand et al. |

OTHER PUBLICATIONS

Peumans, P. et al. Small molecular weight organic thin-film photodetectors and solar cells. Journal of Applied Physics, 2003, vol. 93, No. 7, pp. 3693-3723.

Barry P. Rand et al., "Long-range absorption enhancement in organic tandem thin-film solar cells containing silver nanoclusters," Journal of Applied Physics vol. 96 No. 12, pp. 75197526 (2004).

U.S. Appl. No. 11/263,865 to Rand et al., filed Nov. 2, 2005, entitled "Organic Photovoltaic Cells Utilizing Ultrathin Sensitizing Layer."

U.S. Appl. No. 11/483,641 to Yang et al., filed Jul. 11, 2006, entitled "Controlled Growth of Larger Heterojunction Interface Area for Organic Solar Cells."

Peter Peumans et al., "Efficient bulk heterojunction photovoltaic cells using small-molecular weight organic thin films," Nature vol. 425, pp. 158-162 (2003).

Fan Yang et al., "Controlled growth of a molecular bulk heterojunction photovoltaic cell," Nature Materials vol. 4, pp. 37-41 (Jan. 2005).

U.S. Appl. No. 11/486,163 to Rand et al., filed Jul. 14, 2006, entitled "Architectures and Criteria for the Design of High Efficiency Organic Photovoltaic Cells."

U.S. Appl. No. 11/483,642 to Yang et al., filed Jul. 11, 2006, entitled "Organic Photosensitive Cells Grown on Rough Electrode With Nano-Scale Morphology ControL".

Fan Yang et al., "Organic Solar Cells Using Transparent Sn02-F Anodes," Advanced Materials vol. 18, Issue 15, pp. 2018-2022 (2006).

Gary L. Miessler and Donald A. Tarr, "Inorganic Chemistry," 2 ed., Prentice Hall, pp. 1-3, 422-424 &442 (1999).

International Search Report, PCT/US2007/023912, International filing date Nov. 13, 2007, Date of Mailing, May 29, 2008.

Umeda, T. et al., Improvement of sensitivity in long-wavelength range in organic thin-film solar cell with interpentrating semilayered structure, Japanese Jouranl of Applied Physics, vol. 45, No. 1B, Jan. 20, 2006, pp. 538-541, Tokyo, JP.

Yoshino, K et al., Novel photovoltaic devices based on donor-acceptor molecular and conducting polymer systems. IEEE Transactions on Electron Devices, vol. 44, No. 8, Aug. 1, 1997, pp. 1315-1324, IEEE, USA.

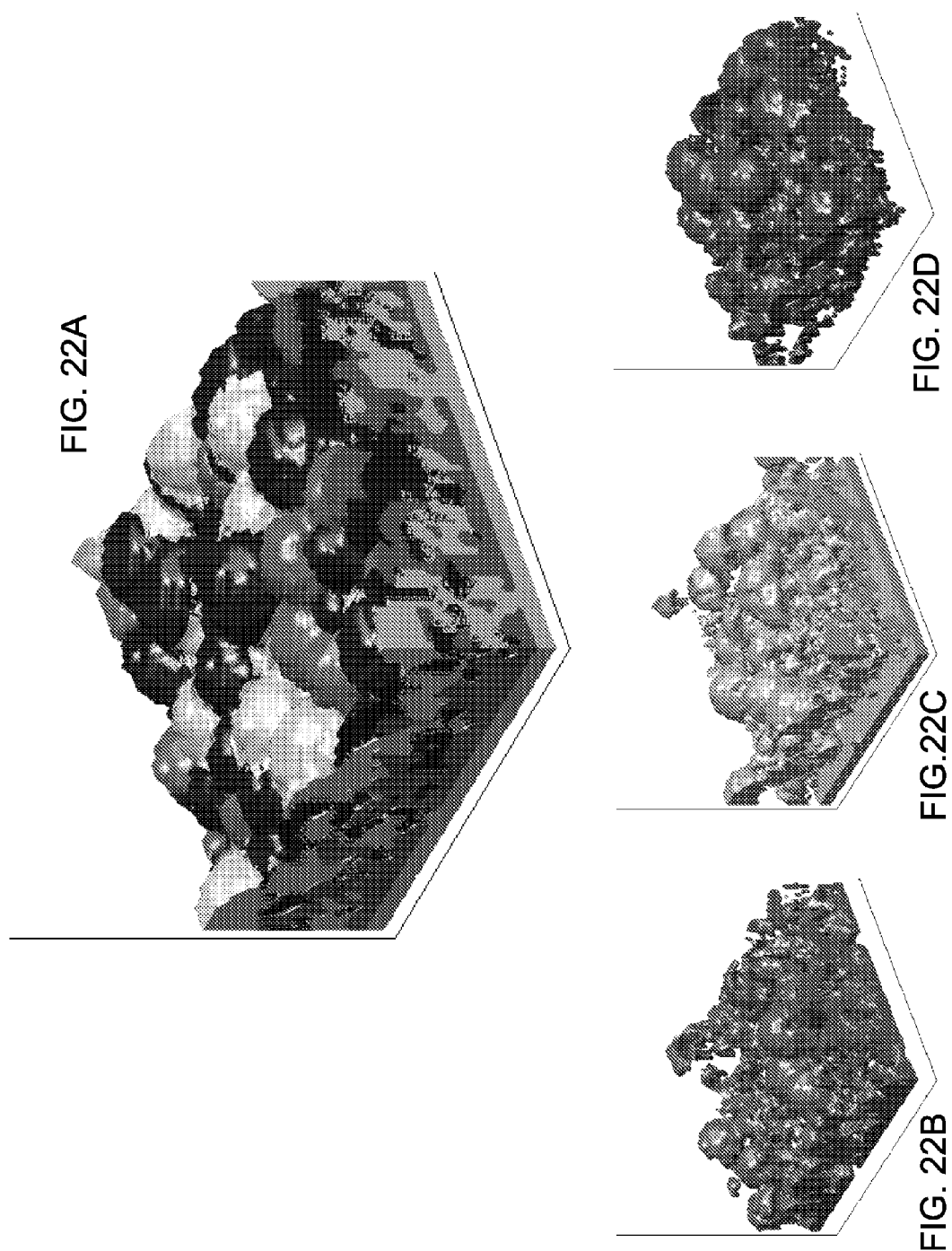

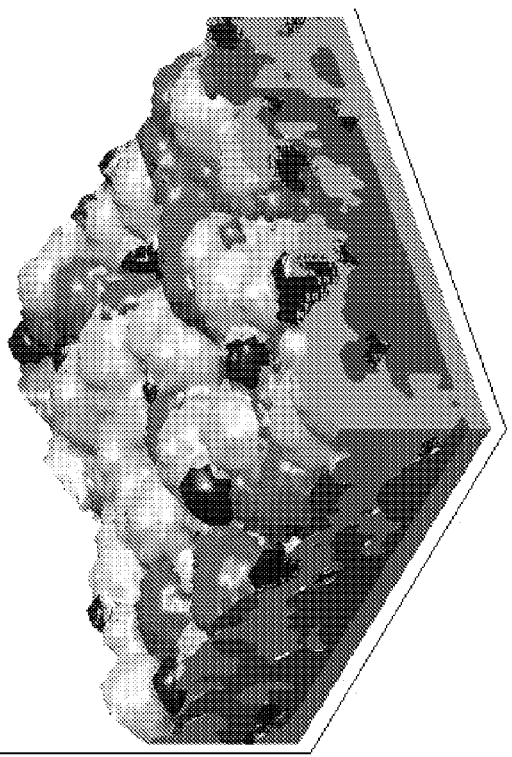
FIG. 23A
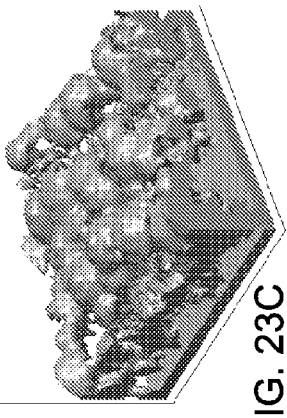
FIG. 23D
FIG. 23C
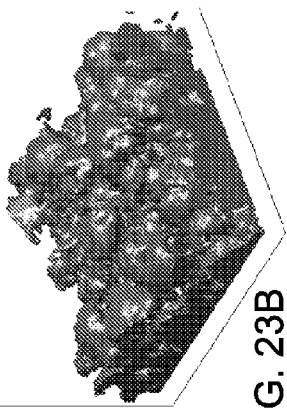
FIG. 23B

ORGANIC HYBRID PLANAR-NANOCRYSTALLINE BULK HETEROJUNCTIONS

This application is a divisional of, and claims the benefit of prior to, application Ser. No. 11/561,448, filed Nov. 20, 2006 (now U.S. Pat. No. 7,897,429), which is incorporated herein by reference in its entirety.

UNITED STATES GOVERNMENT RIGHTS

This invention was made with U.S. Government support under Grant No. DE-AC3698GO10337 and sub-contract XAT 53363603 awarded by U.S. Department of Energy, National Renewable Energy Laboratory. The government has certain rights to this invention.

JOINT RESEARCH AGREEMENT

The claimed invention was made by, on behalf of, and/or in connection with one or more of the following parties to a joint university-corporation research agreement: The University of Michigan, The University of Southern California, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices having nanocrystalline bulk donor-acceptor heterojunctions.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers (for example, if a first layer is "on" or "over" a second layer), unless it is specified that the first layer is "in physical contact with" or "directly on" the second layer; however, this does not preclude surface treatments (e.g., exposure of the first layer to hydrogen plasma).

When electromagnetic radiation of an appropriate energy is incident upon an organic semiconductor material, a photon can be absorbed to produce an excited molecular state. In organic photoconductive materials, the excited molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 dissociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

The invention includes methods for forming optoelectronic devices having improved hybrid planar bulk heterojunctions, as well as the resulting devices.

An example of a photosensitive optoelectronic device having an improved hybrid planar bulk heterojunction includes a plurality of photoconductive materials disposed between an anode and a cathode. The photoconductive materials include a first continuous layer of donor material and a second continuous layer of acceptor material. A first network of donor material or materials extends from the first continuous layer toward the second continuous layer, providing continuous pathways for conduction of holes to the first continuous layer. A second network of acceptor material or materials extends from the second continuous layer toward the first continuous layer, providing continuous pathways for conduction of electrons to the second continuous layer. The first network and the second network are interlaced with each other. At least one other photoconductive material is interspersed between the interlaced networks. This other photoconductive material or materials has an absorption spectra different from the donor and acceptor materials.

Preferably, the first network, the second network, and the photoconductive material or materials interspersed between the interlaced networks each consist essentially of plural crystallites of the respective organic photoconductive material. Each of the crystallites preferably has no dimension greater than 100 nm.

As absorption-spectra sensitizers, a wide variety of materials can be utilized as the interspersed photoconductive material or materials. For example, a photoconductive material having a wider bandgap than the donor and acceptor materials can be interspersed between the interlaced networks, and/or a photoconductive material having a narrower bandgap than the donor and acceptor materials can be interspersed between the interlaced networks.

As a further example, a photoconductive material can be interspersed between the interlaced networks having a HOMO that is less than a HOMO of the donor material of the first continuous layer and greater than a HOMO of the acceptor material of the second continuous layer, and having a LUMO that is less than a LUMO of the donor material of the first continuous layer and greater than a LUMO of the acceptor material of the second continuous layer.

A plurality of different sensitizers can be interspersed. For example, the interspersed photoconductive materials can include a first sensitizer and a second sensitizer, with the first sensitizer and the second sensitizer having absorption spectra different from the donor and acceptor materials, and different from each other.

The first continuous layer and the first network can be composed of a same donor material. Likewise, the second continuous layer and the second network can be composed of a same acceptor material. Portions of the networks and the continuous layers may also be composed of different donor and acceptor materials. For example, at least portions of the first network can include a donor material different from the donor material of the first continuous layer. Likewise, at least portions of the second network can include an acceptor material different from the acceptor material of the second continuous layer.

The interspersed photoconductive materials preferably comprises a plurality of sensitizers interspersed with a repeating pattern between the first continuous layer and the second continuous layer.

The structure may include additional layers, such as an exciton blocking layer arranged between the anode and the first continuous layer, and/or an exciton blocking layer arranged between the cathode and the second continuous layer.

An example of a method for fabricating such a photosensitive optoelectronic device includes depositing a first organic photoconductive material over a first electrode to form a first continuous layer, depositing at least three discontinuous layers of photoconductive material directly over the first continuous layer, material of each discontinuous layer being in direct contact with material of at least one adjacent discontinuous layer, portions of an underlying layer or layers being exposed through gaps in each respective discontinuous layer, depositing a second organic photoconductive material directly over the discontinuous layers to form a second continuous layer, filling exposed gaps and recesses in the discontinuous layers, and depositing a second electrode over the second continuous layer. At least one of the discontinuous layers and one of the continuous layers are composed of donor materials and form continuous pathways for conduction of holes therebetween. At least one of the discontinuous layers and an other of the continuous layers are composed of acceptor materials and form continuous pathways for conduction of electrons therebetween. At least one of the discontinuous layers is composed of a third photoconductive material having an absorption spectra different from the donor and acceptor materials.

Preferably, during the depositing of each respective discontinuous layer, each growth area of photoconductive material within the discontinuous layer preferably contributes no more than 100 nm of growth in any dimension, each growth area forms a crystallite of the respective organic photoconductive material, and crystallite nucleation during deposition of each discontinuous layer occurs at an interface with an underlying layer.

A wide variety of materials can be selected as the third photoconductive material. For example, the third photoconductive material may have a wider bandgap than the donor and acceptor materials. As another example, the third photoconductive material may have a narrower bandgap than the donor and acceptor materials.

As a further example, if the first photoconductive material is an acceptor and the second photoconductive material is a donor, the third photoconductive material can be selected to have a HOMO that is greater than a HOMO of the first organic photoconductive material and less than a HOMO of the second organic photoconductive material, and to have a LUMO that is greater than a LUMO of the first organic photoconductive material and less than a LUMO of the second organic photoconductive material.

As a further example, if the first photoconductive material is a donor and the second photoconductive material is an acceptor, the third photoconductive material can be selected to have a HOMO that is less than a HOMO of the first organic photoconductive material and greater than a HOMO of the second organic photoconductive material, and to have a LUMO that is less than a LUMO of the first organic photoconductive material and greater than a LUMO of the second organic photoconductive material.

Multiple other photoconductive materials can be included as discontinuous layers in addition to the layers of the third photoconductive material. For example, the discontinuous layers can further include at least one layer of a fourth photoconductive material having an absorption spectra different from the donor materials, the acceptor materials, and the third photoconductive material.

A same donor material can used to form one of the continuous layers and at least one of the discontinuous layers. Likewise, a same acceptor material is used to form one of the continuous layers and at least one of the discontinuous layers.

Depositing the discontinuous layers may include repeating deposition of a sequence of plural photoconductive materials multiple times.

Other layers may also be deposited. For example, at least one exciton blocking layer may be deposited, such as an exciton blocking layer between the first electrode and the first continuous layer, and/or between the second electrode and the second continuous layer.

Preferably, there are a plurality of discontinuous layers composed of a donor material or materials forming conductive pathways with the continuous donor layer, and there are a plurality of discontinuous layers composed of an acceptor material or materials forming conductive pathways with the continuous acceptor layer.

BRIEF DESCRIPTION OF THE DRAWINGS

FIG. 22A is a simulated example hybrid planar-nanocrystalline bulk heterojunction structure. FIGS. 22B to 22D illustrate the constituent components of the structure.

FIG. 23A is a simulated example hybrid planar-nanocrystalline bulk heterojunction structure. FIGS. 23B to 23D illustrate the constituent components of the structure.

DETAILED DESCRIPTION

Figure 1:
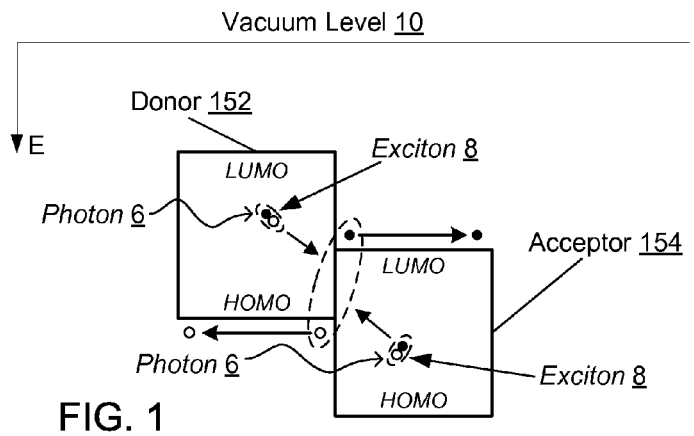
FIG. 1 is an energy level diagram illustrating a donor-acceptor heterojunction.
Figure 2:
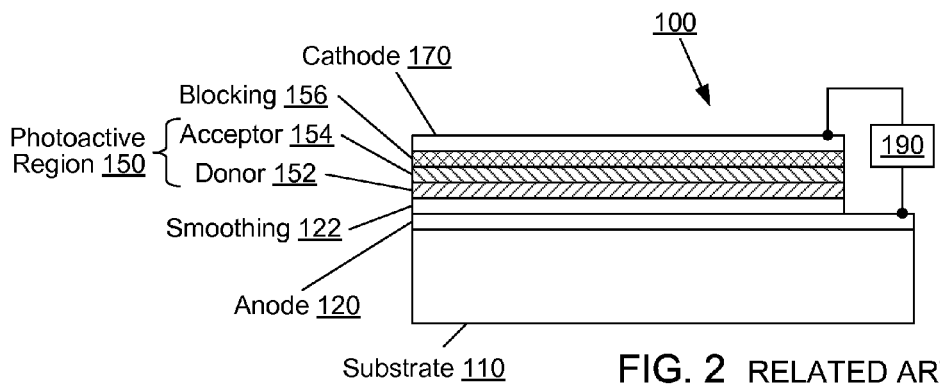
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs (among other things) reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, organic vapor-jet deposition, inkjet printing and other methods known in the art.

Figure 3:
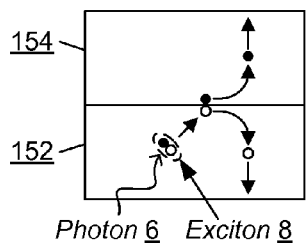
FIG. 3 illustrates a donor-acceptor bilayer forming a planar heterojunction.
Figure 4:
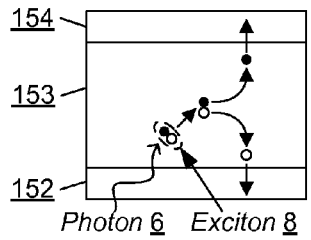
FIG. 4 illustrates a hybrid heterojunction including a mixed heterojunction between a donor layer and an acceptor layer.
Figure 5:
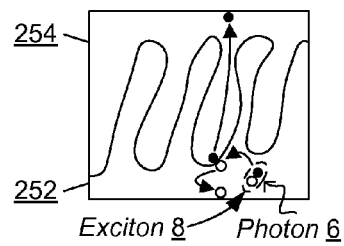
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials arranged between the donor material 152 and the acceptor material 154. FIG. 5 illustrates an idealized "bulk" heterojunction. A bulk heterojunction, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
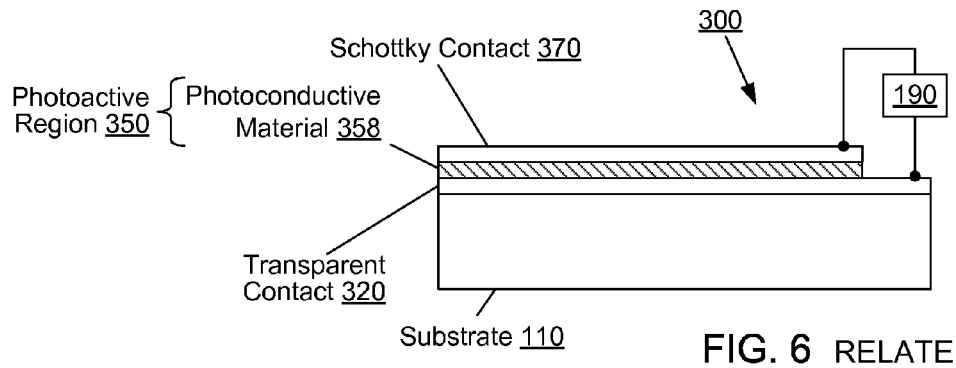
FIG. 6 illustrates an organic photosensitive device including a Schottky-barrier heterojunction.

FIG. 6 shows an example of a organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the dissociation at a donor-acceptor interface.

The devices as illustrated may be connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; Published U.S. Patent Application 2006-0032529 A1, entitled "Organic Photosensitive Devices" by Rand et al., published Feb. 16, 2006; and Published U.S. Patent Application 2006-0027802 A1, entitled "Stacked Organic Photosensitive Devices" by Forrest et al., published Feb. 9, 2006; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
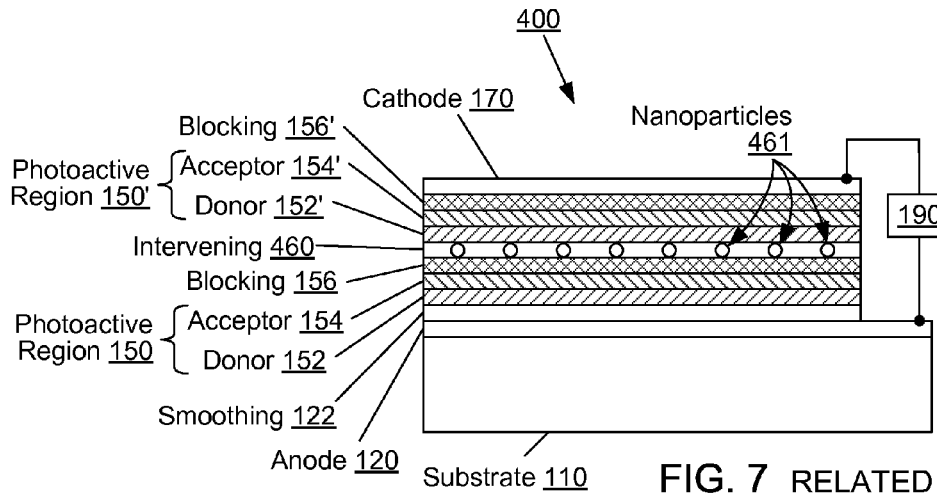
FIG. 7 illustrates tandem photosensitive cells in series.
Figure 8:
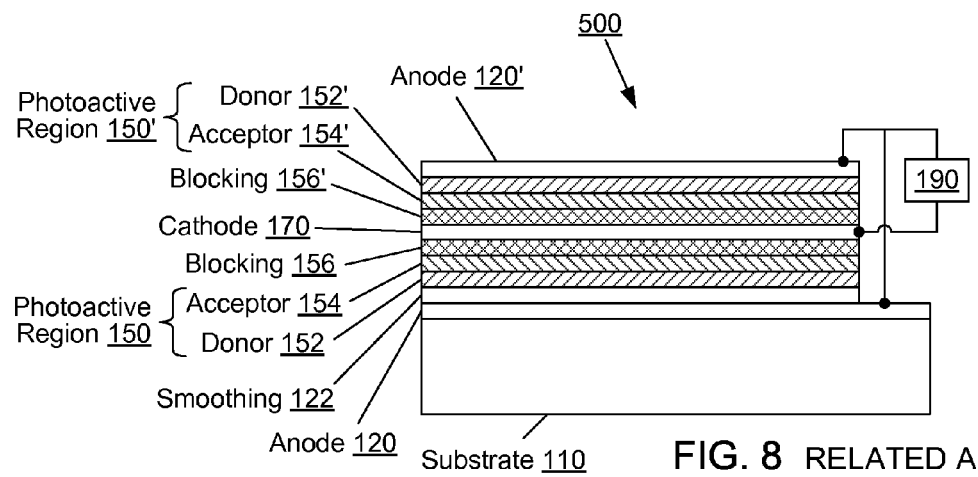
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in Published US Patent Application No. 2005-0266218 A1, entitled "Aperiodic dielectric multilayer stack" by Peumans et al., published Dec. 1, 2005, which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

As described herein, high surface area hybrid planar bulk heterojunction devices are grown by controlled growth methods. Additional photoconductive materials are added to broaden the absorption spectra without detriment to carrier collection. Use of nanocrystalline organic photoconductor domains enhances carrier collection and transport.

Controlled growth of nano-crystals generates a network of continuous conductive pathways for carrier collection, providing a high-density of interfaces for exciton dissociation and a quasi-random arrangement of materials. The network of crystalline and/or polycrystalline pathways form a three-dimensional matrix, providing improved carrier mobility and lower series resistance in comparison to amorphous-phase mixed layers, and further enhances the absorption of light due to the ability to form thicker devices.

Each discontinuous layer of nano-crystals is composed of plural crystallites of photoconductive material. To produce high-quality grain boundaries between layers, growth conditions are controlled to promote nucleation of the crystallites at the interface with the previously deposited photoconductive layers. Crystal growth in transit to the surface is inhibited (e.g., gas-phase nucleation within the carrier gas ambient is inhibited).

Any controlled-growth technique able to grow organic molecular crystals on-site (at the deposition surface) can be used to make the discontinuous layers. The controlled-growth techniques that are contemplated include organic vapor phase deposition (OVPD), organic vapor jet deposition (OVJD; also known as organic vapor jet printing), vacuum thermal evaporation (VTE), and organic molecular beam deposition (OMBD).

In addition to employing controlled surface growth and keeping the discontinuous layers thin to promote lateral separation between crystallites, supplemental deposition techniques can be used to minimize the occurrence of isolated islands of donor and acceptor materials that do not connect to an electrically conductive pathway for their respective charge carriers. These techniques include selective deposition (e.g., using a shadow mask placed close to the substrate; targeted pulsing, angling and/or positioning the molecular beam or nozzles), and tilting the substrate between layers to provide a degree of control that can help minimize the occurrence of islands. Selectivity may also include changing the position of the substrate relative to the gas flow (OVJD, OVPD) during the deposition process.

Figure 9A:
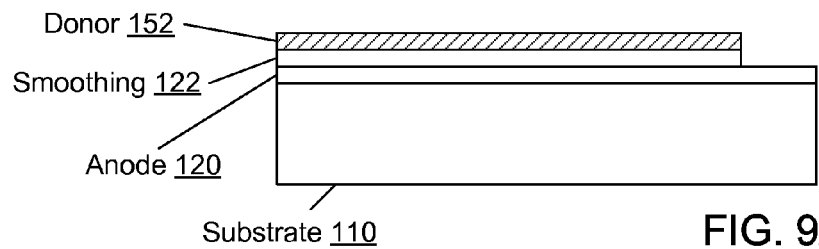
FIGS. 9A-9H illustrate steps of forming a hybrid planar-nanocrystalline bulk heterojunction including an additional embedded photoconductive material.
Figure 9B:
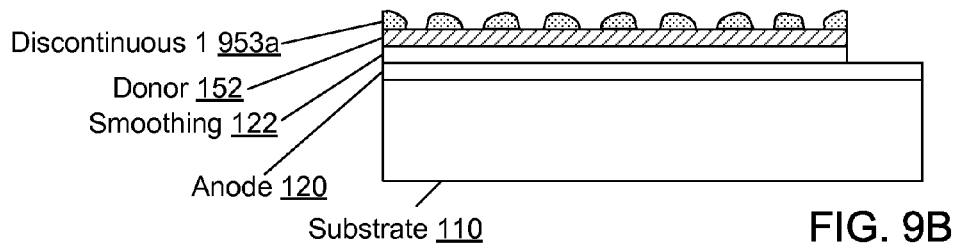
Figure 9C:
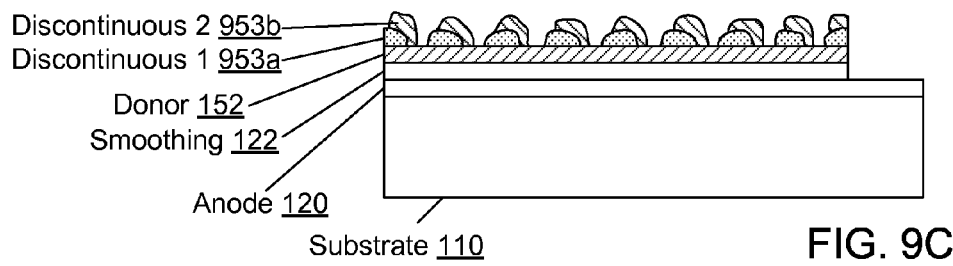
Figure 9D:
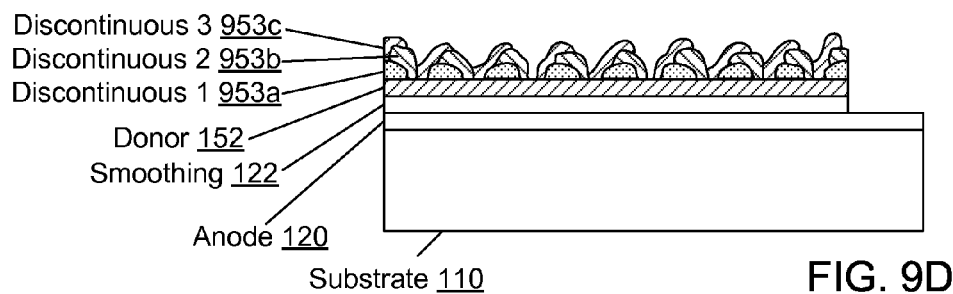

FIGS. 9A through 9H illustrate process steps demonstrating a simple example. A continuous donor layer 152 is deposited in FIG. 9A prior to the growth of the nanocrystalline discontinuous layers. In FIG. 9B, plural nanocrystals are deposited as a first discontinuous layer 953a. In this example, the material used for the first discontinuous layer 953a is selected to broaden the absorption spectra beyond that provided by the donor and acceptor materials. In FIG. 9C, plural nanocrystals of an acceptor material are deposited as a second discontinuous layer 953b. In FIG. 9D, plural nanocrystals of a donor material are deposited as a third discontinuous layer 953c. Most of the nanocrystals of the donor material shown in the cross-section directly contact the continuous donor layer 152, providing electrically conductive pathways for dissociated holes from layer 953c to the anode 120 in the finished device.

Figure 9E:
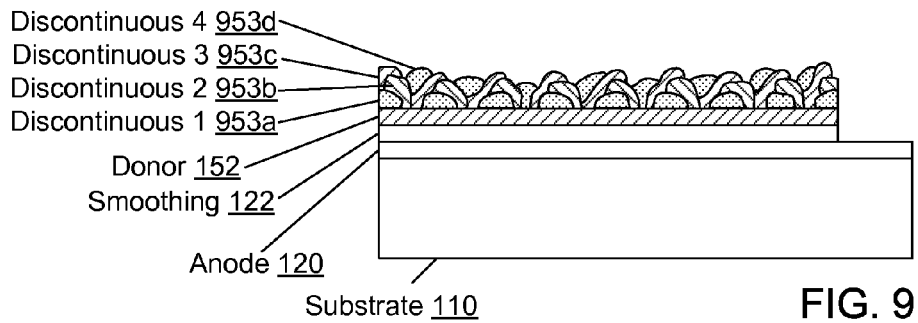
Figure 9F:
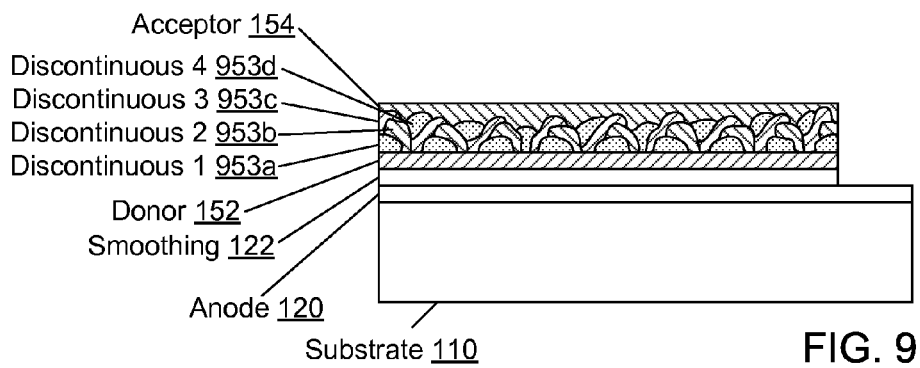
Figure 9G:
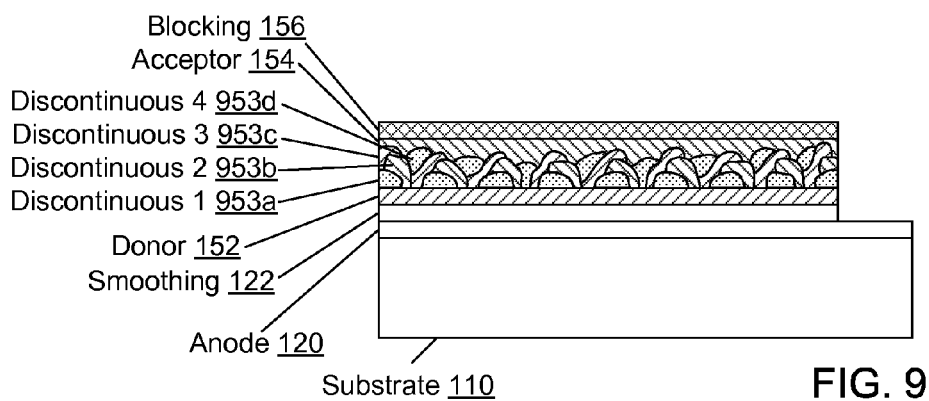
Figure 9H:
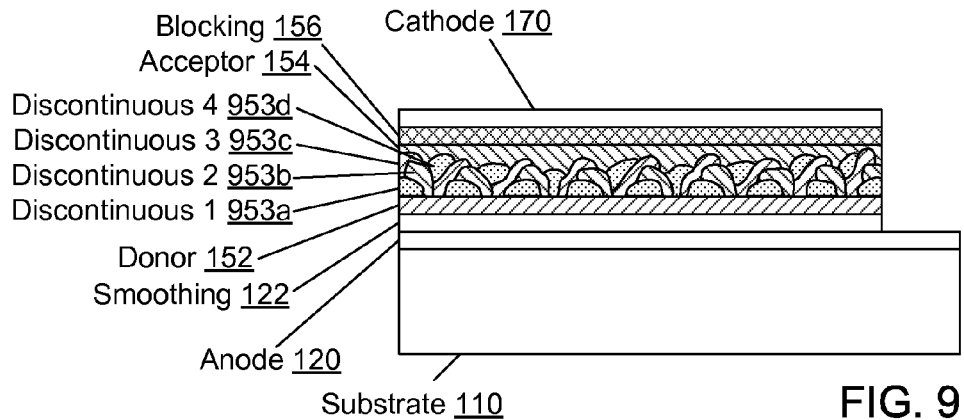
Figure 10:
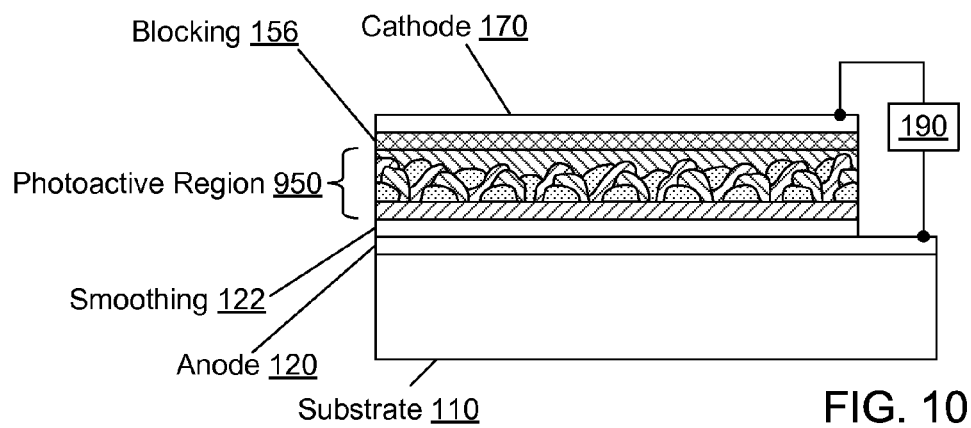
FIG. 10 illustrates a circuit utilizing the device formed by the method in FIGS. 9A-9H.

In FIG. 9E, plural nanocrystals are deposited as a fourth discontinuous layer 953d. In this example, the material used for layer 953d is the same as the material used for layer 953a. In FIG. 9F, a continuous acceptor layer 154 is deposited. The continuous acceptor layer 154 fills exposed gaps and recesses in the underlying discontinuous layers 953a-d. Most of the nanocrystals of acceptor material in discontinuous layer 953b shown in the cross-section directly contact the continuous acceptor layer 154, providing electrically conductive pathways for dissociated electrons from layer 953b to the cathode in the finished device. In FIG. 9G, an exciton blocking layer 156 is added, and in FIG. 9H, a cathode 170 is deposited. FIG. 10 illustrates the finished example device having hybrid planar bulk heterojunction photoactive region 950 arranged in a circuit with element 190.

The example in FIGS. 9A to 9H follows a deposition pattern of A(continuous donor layer)/B(discontinuous sensitizer layer)/C(discontinuous acceptor layer)/A(discontinuous donor layer)/B(discontinuous sensitizer layer)/C(continuous acceptor layer). This basic design can be expanded by repeating deposition of a sequence of plural photoconductive materials multiple times. For example, a deposition pattern of A/{B/C/A}×n/B/C or the equivalent A/B/{C/A/B}×n/C, where "n" is the number of pattern repetitions.

Using these basic deposition techniques, almost any pattern is possible. For example, a deposition pattern of A(continuous)/{B(discontinuous)/C(discontinuous)/A(discontinuous)}×n/C(continuous) would be efficient for use in a solar cell, provided that A, B, and C have different absorption spectra, "A" is a donor or acceptor material, and "C" is the other of the donor and acceptor materials.

Figure 11A:
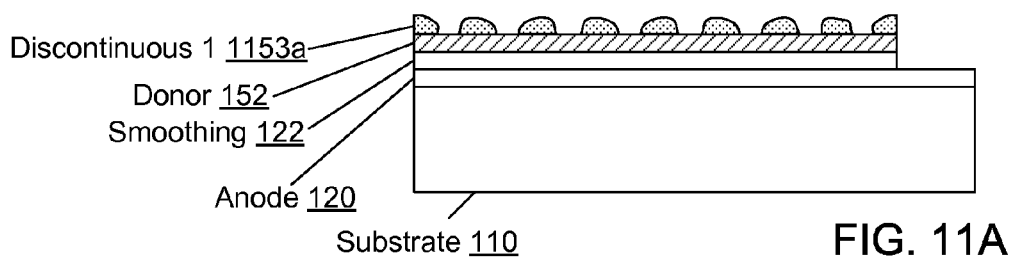
FIGS. 11A-11I illustrate steps of forming a hybrid planar-nanocrystalline bulk heterojunction similar to the one made in FIGS. 9A-9H, but demonstrating the deposition of multiple discontinuous acceptor layers and donor layers, forming a network of electrically conductive pathways between the discontinuous donor layers and forming a network of electrically conductive pathways between the discontinuous acceptor layers.
Figure 11B:
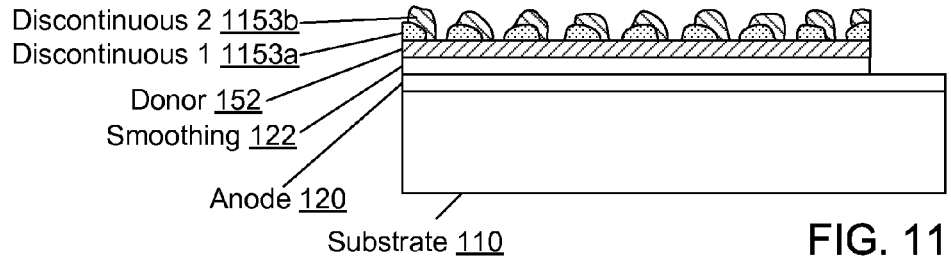
Figure 11C:
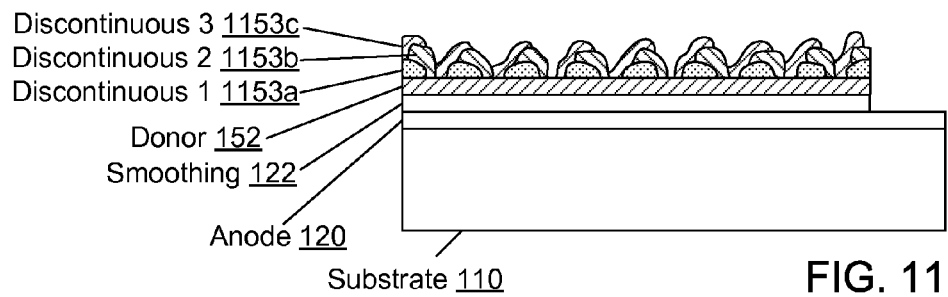

FIGS. 11A through 11I illustrate a simple example of a repeating deposition sequence of A/{B/C/A}×2/B/C. In FIG. 11A, a first discontinuous layer 1153a of nanocrystals is deposited on a continuous donor layer 152. The material used for the first discontinuous layer 1153a is selected to broaden the absorption spectra beyond that provided by the donor and acceptor materials. In FIG. 11B, plural nanocrystals of an acceptor material are deposited as a second discontinuous layer 1153b. In FIG. 11C, plural nanocrystals of a donor material are deposited as a third discontinuous layer 1153c. As illustrated in this cross-section, most of the nanocrystals of donor material in layer 1153c directly contact the continuous donor layer 152, providing electrically conductive pathways for dissociated holes from layer 1153c to the anode 120 in the finished device.

Figure 11D:
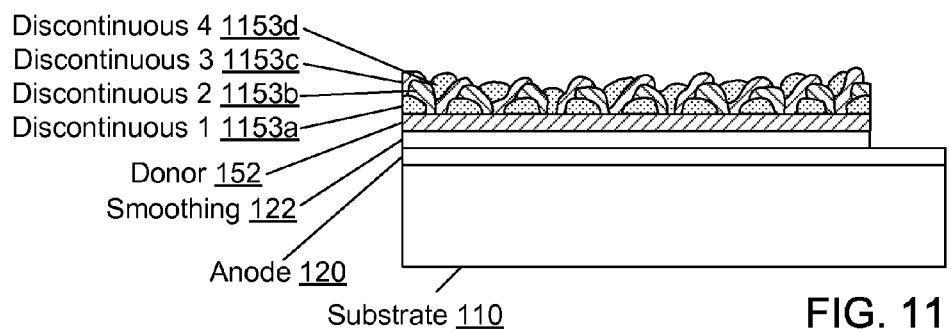
Figure 11E:
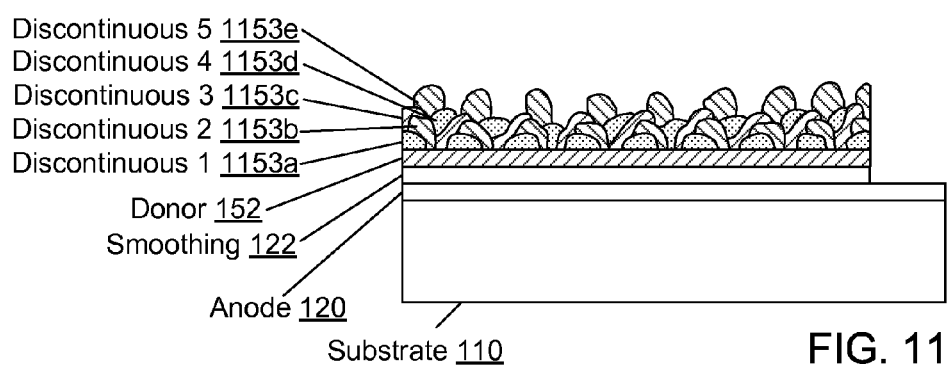
Figure 11F:
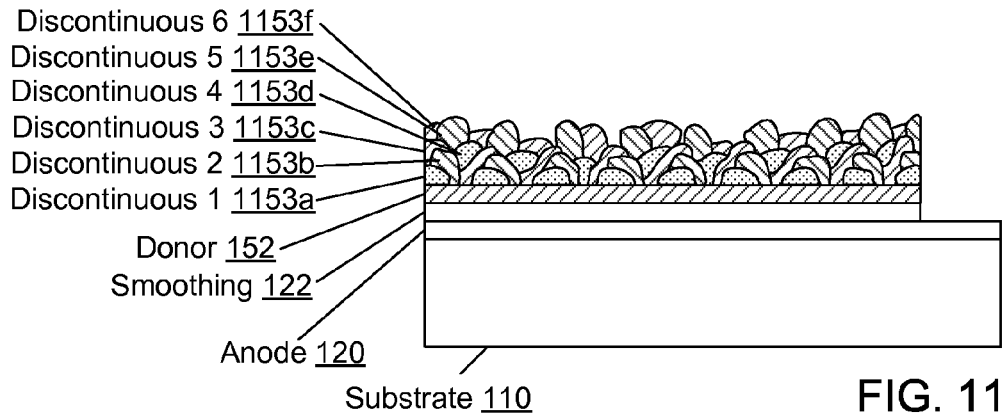

In FIG. 11D, plural nanocrystals are deposited as a fourth discontinuous layer 1153d. In this example, the material used for layer 1153d is the same as the material used for layer 1153a. In FIG. 11E, plural nanocrystals of an acceptor material are deposited as a fifth discontinuous layer 1153e. In FIG. 11F, plural nanocrystals of a donor material are deposited as a sixth discontinuous layer 1153f. Most of the nanocrystals of donor material in layer 1153f directly contact the nanocrystals in discontinuous donor layer 1153c, providing electrically conductive pathways for dissociated holes from layer 1153f to the anode 120 in the finished device.

Figure 11G:
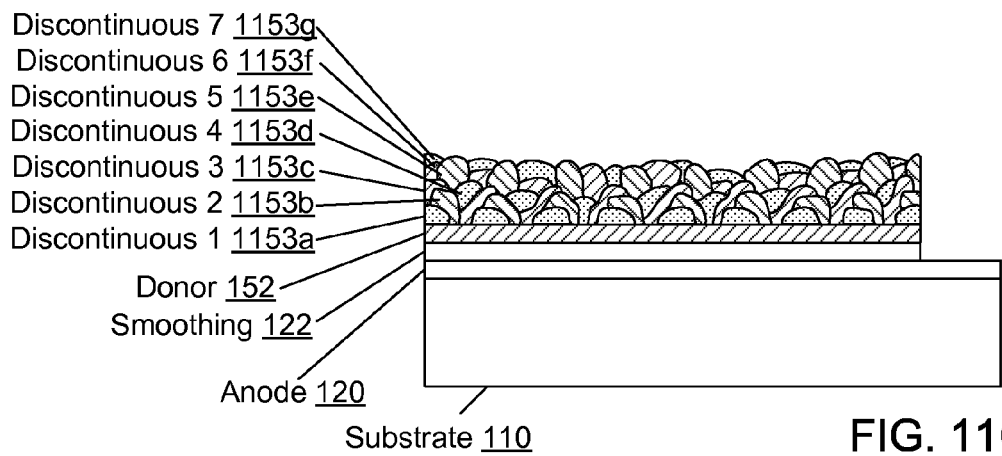
Figure 11H:
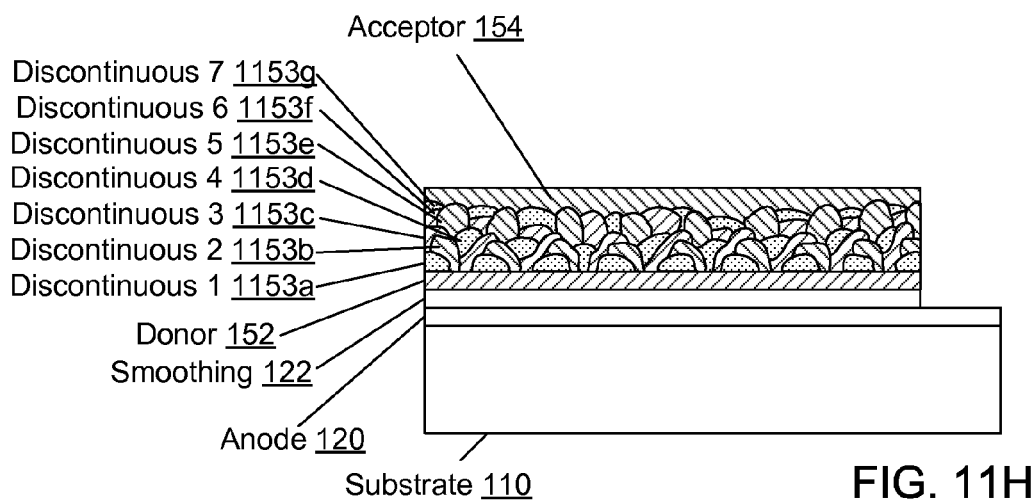
Figure 11I:
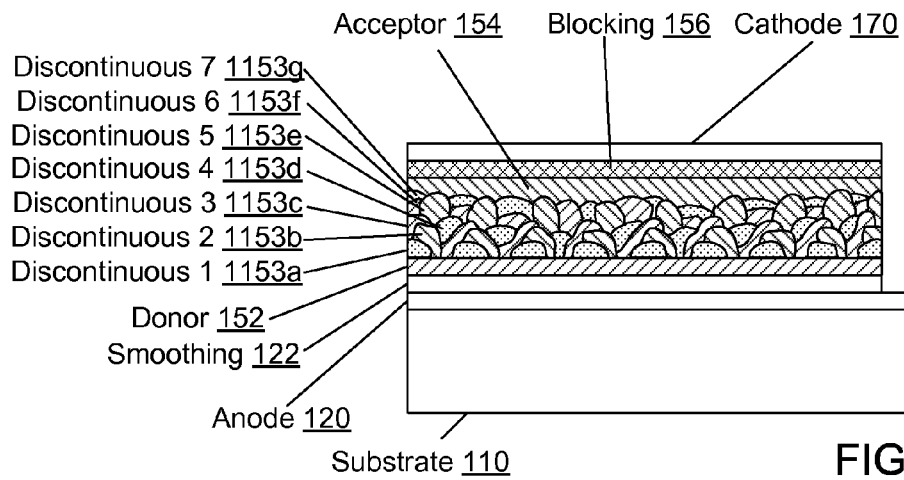
Figure 12:
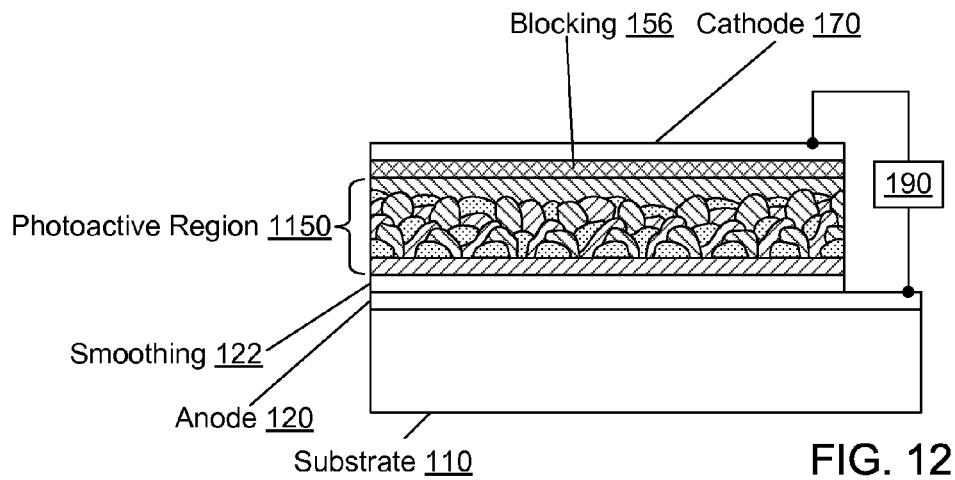
FIG. 12 illustrates a circuit utilizing the device formed by the method in FIGS. 11A-11I.

In FIG. 11G, plural nanocrystals are deposited as a seventh discontinuous layer 1153g. In this example, the material used for layer 1153g is the same as the material used for layers 1153a and 1153d. In FIG. 11H, a continuous acceptor layer 154 is deposited. The continuous acceptor layer 154 fills exposed gaps and recesses in the underlying discontinuous layers 1153a-g. Most of the nanocrystals of acceptor material in discontinuous layers 1153b directly contact nanocrystals in discontinuous layer 1153e, and the nanocrystals in discontinuous layer 1153e directly contact the continuous acceptor layer 154, providing electrically conductive pathways for dissociated electrons from layers 1153b and 1153e to the cathode in the finished device. In FIG. 11I, an exciton blocking layer 156 and then a cathode 170 are deposited. FIG. 12 illustrates the finished example device having a hybrid planar-nanocrystalline bulk heterojunction photoactive region 1150 arranged in a circuit with element 190.

Figure 13A:
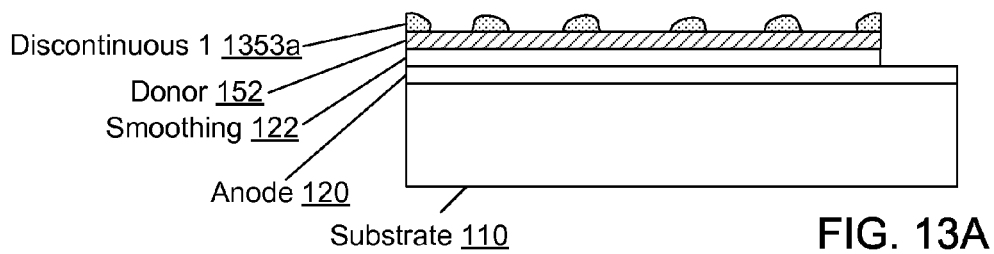
FIGS. 13A-13H illustrate steps of forming a hybrid planar-nanocrystalline bulk heterojunction similar to the one made in FIGS. 9A-9H, but including a plurality of additional embedded photoconductive materials.
Figure 13B:
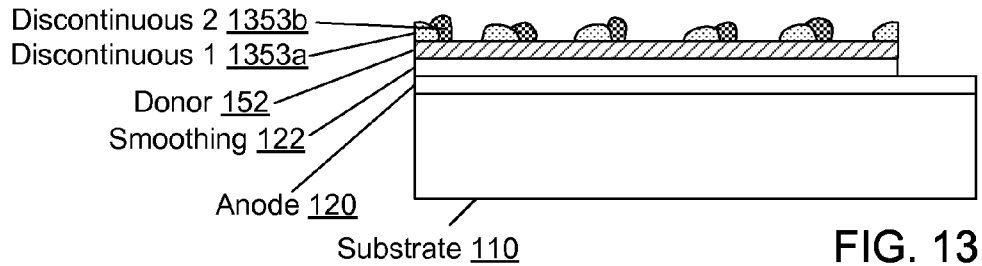
Figure 13C:
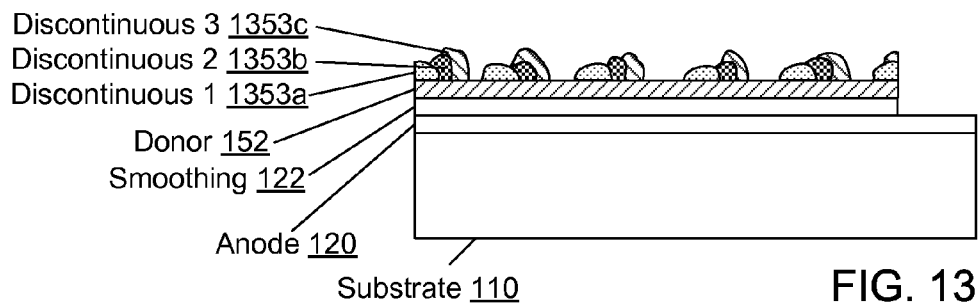
Figure 13D:
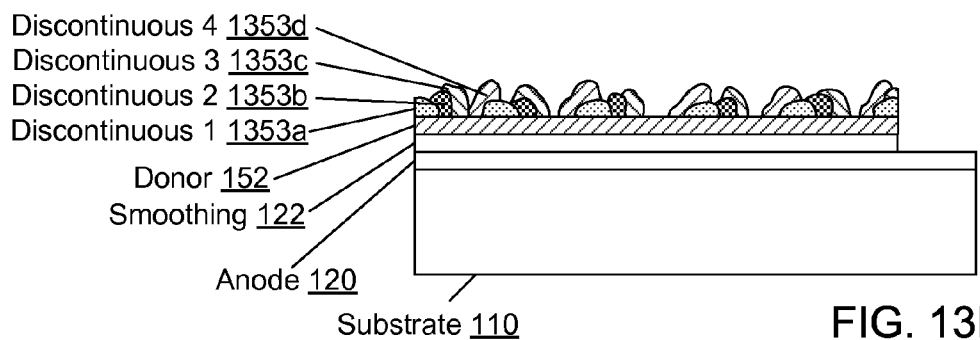

While the examples in FIGS. 9 through 12 all utilize a single absorption spectra sensitizing material with a donor material and an acceptor material, a strength of the architecture is that many different sensitizing materials can be used simultaneously. FIGS. 13A through 13H illustrate a simple example of a deposition sequence of A/{B/C/D/A}×1/B/C/D. In FIG. 13A, a first discontinuous layer 1353a of nanocrystals is deposited on a continuous donor layer 152. The material used for the first discontinuous layer 1353a is a first sensitizer selected to broaden the absorption spectra beyond that provided by the other materials. In FIG. 13B, a second discontinuous layer 1353b of nanocrystals is deposited. The material used for the second discontinuous layer 1353b is a second sensitizer selected to broaden the absorption spectra beyond that provided by the other materials. In FIG. 13C, plural nanocrystals of an acceptor material are deposited as a third discontinuous layer 1353c. In FIG. 13D, plural nanocrystals of a donor material are deposited as a fourth discontinuous layer 1353d. Most of the nanocrystals of donor material in layer 1353d directly contact the continuous donor layer 152, providing electrically conductive pathways for dissociated holes from layer 1353d to the anode 120 in the finished device.

Figure 13E:
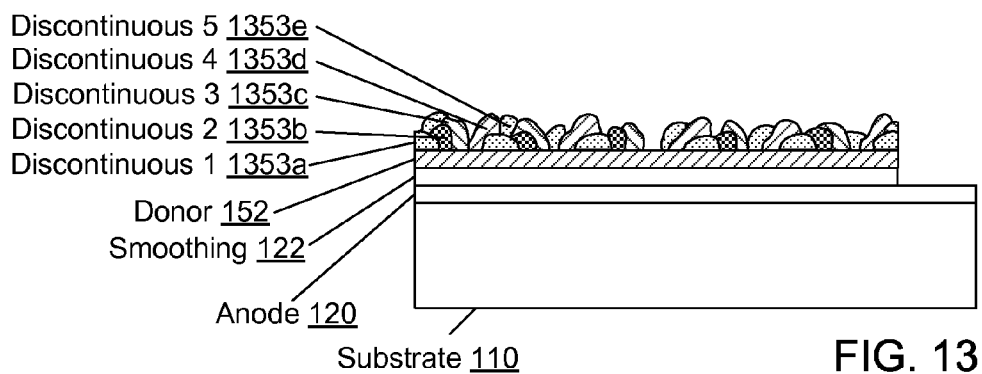
Figure 13F:
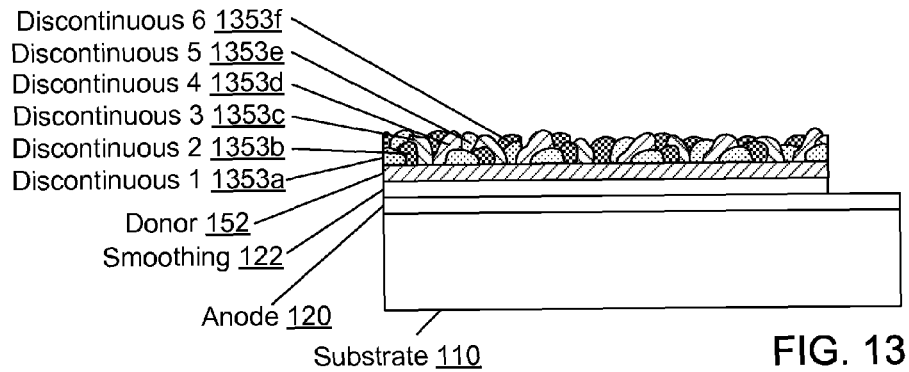

In FIG. 13E, plural nanocrystals are deposited as a fifth discontinuous layer 1353e. In this example, the material used for layer 1353e is the first sensitizer used for layer 1353a. In FIG. 13F, plural nanocrystals are deposited as a sixth discontinuous layer 1353f. In this example, the material used for layer 1353f is the second sensitizer used for layer 1353b.

Figure 13G:
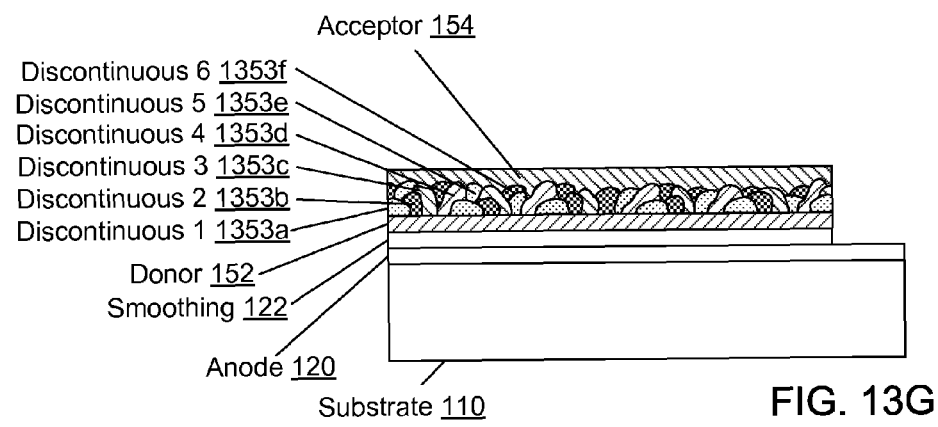
Figure 13H:
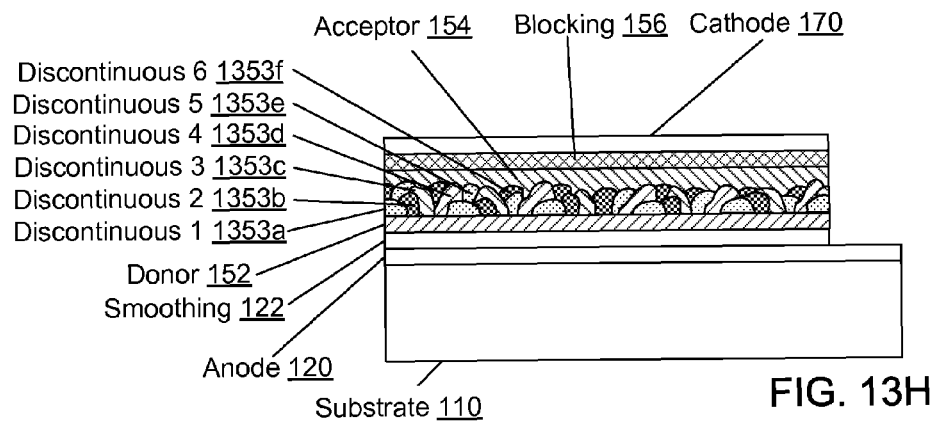
Figure 14:
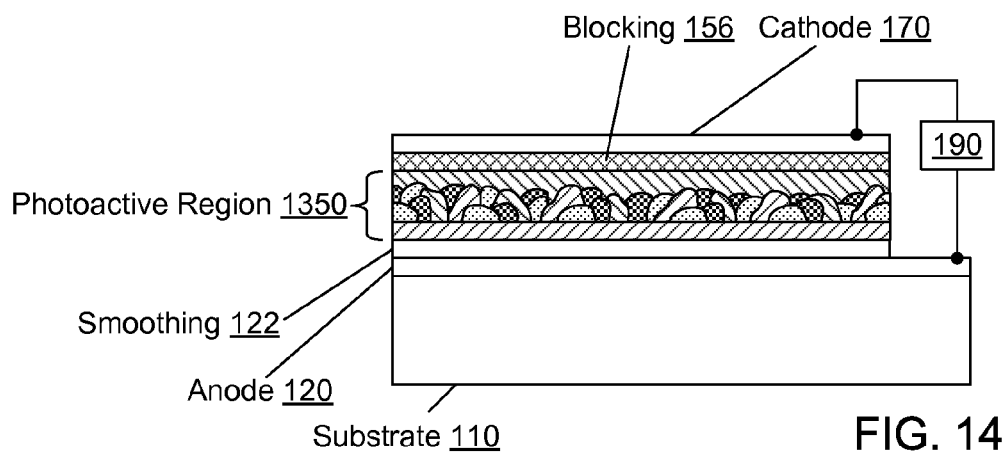
FIG. 14 illustrates a circuit utilizing the device formed by the method in FIGS. 13A-13H.

In FIG. 13G, a continuous acceptor layer 154 is deposited. The continuous acceptor layer 154 fills exposed gaps and recesses in the underlying discontinuous layers 1353a-f. Most of the nanocrystals of acceptor material in discontinuous layer 1353c directly contact the continuous acceptor layer 154, providing electrically conductive pathways for dissociated electrons from layers 1353c to the cathode in the finished device. In FIG. 13H, an exciton blocking layer 156 and then a cathode 170 are deposited. FIG. 14 illustrates the finished example device having hybrid planar-nanocrystalline bulk photoactive region 1350 arranged in a circuit with element 190.

While there is no limit on the number of different sensitizing materials that might be used in a single hybrid planar nanocrystlline bulk heterojunction structure, it is not thought to be worthwhile to use more than 10 or 11 different sensitizers (in addition to the donor and acceptor materials), since further increase in the number of sensitizers would achieve diminishing returns in terms of broadening spectral coverage. Additionally, the complexity of growth and manufacturing increases with the increasing number of different materials.

During the growth of each discontinuous layer, the contribution of each discontinuous growth area (nanocrystal) is preferably no more than 100 nm in any direction. More preferably, from any point within each nanocrystal, a distance to an interface boundary with another material is preferably no more than 1.5 exciton diffusion lengths of the material forming the respective nanocrystal. Yet more preferably, a thickness of the growth contribution of electrically conductive materials is less than or equal to 60 Å, and a thickness of the growth contribution for materials that may otherwise block carrier transport be less than or equal to 40 Å (e.g., TAZ: 3-phenyl-4-(1'-naphthyl)-5-phenyl-1,2,4-triazole and/or SnPc: tin phthalocyanine if used as sensitizers with $C_{60}$ as acceptor and CuPc: copper phthalocyanine as donor).

From any point within either of the continuous layers, a distance to an interface boundary with a photoconductive material of an opposite material type is preferably no more than 2.5 exciton diffusion lengths of the photoconductive material forming the respective continuous layer.

A strength of the architecture is that most any pattern of materials can be used, so long as the donor materials and acceptor materials each form conductive networks providing charge collection percolation pathways to the anode and cathode (respectively). For example, a deposition sequence including 5 materials can be A(continuous)/{B(discontinuous)/C(discontinuous)/D(discontinuous)/E(discontinuous)/A(discontinuous)}×n/B(continuous), where "C", "D", and "E" are three different sensitizers, "A" is a donor material or an acceptor material, and "B" is the other of the donor and the acceptor material. Another example is A(continuous)/{B(discontinuous)/C(discontinuous)/D(discontinuous)/A(discontinuous)/B(discontinuous)}/C(continuous), where "B" and "D" are two different sensitizers, "A" is a donor material or an acceptor material, and "C" is the other of the donor and the acceptor material.

Figure 15:
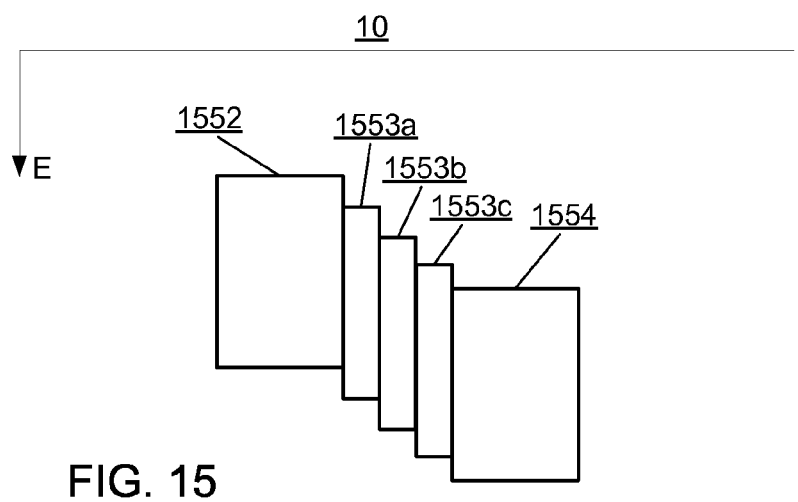
FIG. 15 is an energy level diagram for a preferred arrangement of sensitizer materials between a donor and an acceptor.

While the pattern of sensitizers interspersed between the donor-acceptor network can be random, a preferred embodiment is to arrange a plurality of sensitizer materials between the donor and the acceptor networks to form an energy cascade, creating a charge-separating built-in potential to spatially dissociate photogenerated excitons. For example, FIG. 15 illustrates an energy level diagram including three sensitizers 1553a-1553c arranged between a donor network 1552 and an acceptor network 1554. For further discussion of spatial dissociation of photogenerated excitons using an energy cascade, see U.S. patent application Ser. No. 11/486,163 by B. Rand et al. filed Jul. 14, 2006 entitled "New Architectures and Criteria For the Design of High Efficiency Organic Photovoltaic Cells," incorporated herein by reference.

Figure 16:
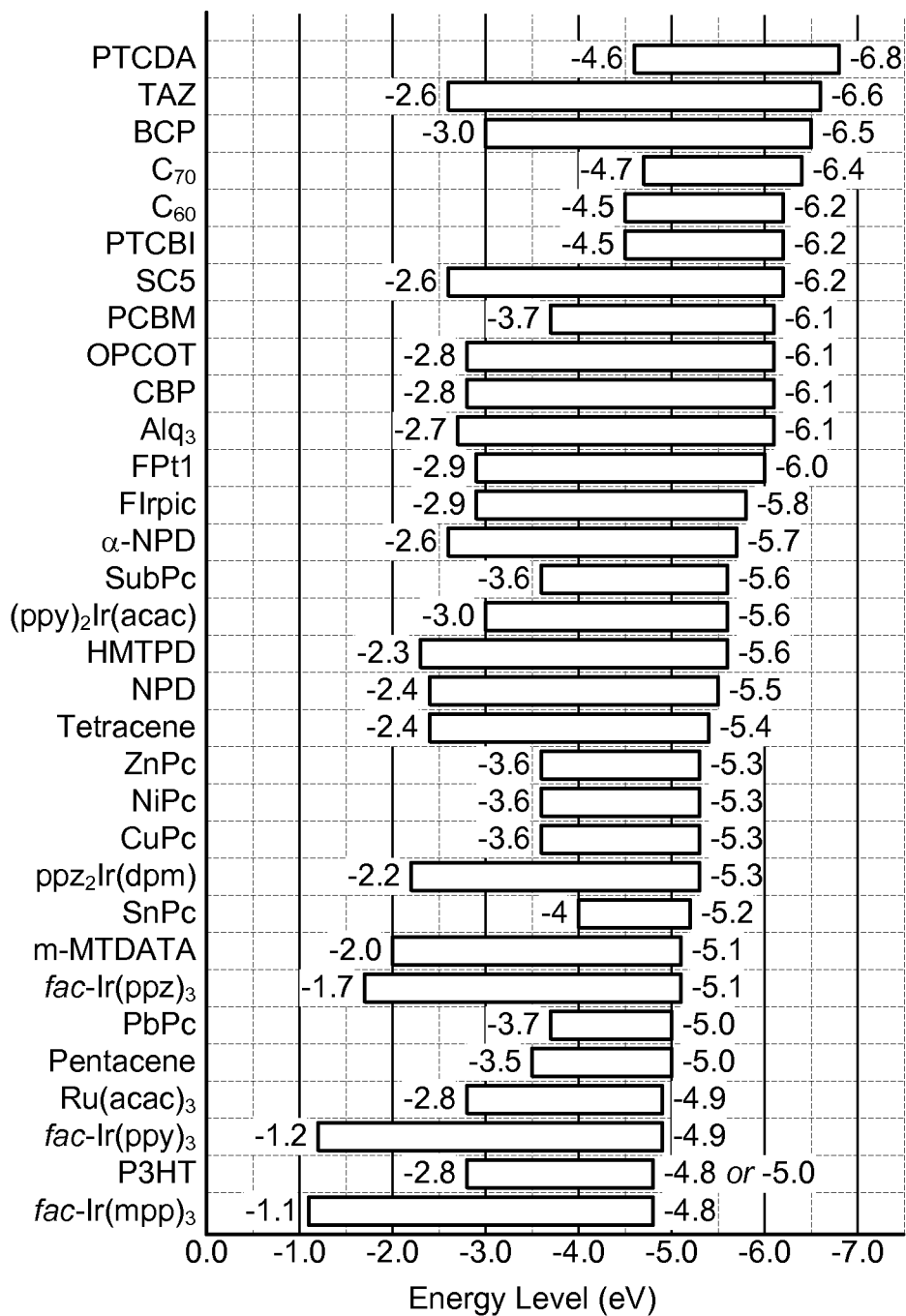
FIG. 16 demonstrates the relative HOMO and LUMO levels and energy gaps for a variety of organic photoconductive materials as non-exclusive examples of materials that can be used within the photoactive region of a hybrid planar-nanocrystalline bulk heterojunction as donors, acceptors, and sensitizers.

To demonstrate the practicality of designing the arrangement illustrated in FIG. 15, FIG. 16 illustrates the HOMOs and LUMOs for a variety of organic semiconductor materials. The figure is oriented sideways, with vacuum level (0 eV) on the left side. The full name of the listed materials are as follows:
PTCDA: 3,4,9,10-perylenetetracarboxylic dianhydride.
TAZ: 3-phenyl-4-(1'-naphthyl)-5-phenyl-1,2,4-triazole.
BCP: 2,9-dimethyl-4,7-diphenyl-1,10-phenanthroline.
$C_{60}$: $C_{60}$.
$C_{70}$: $C_{70}$.
PTCBI: 3,4,9,10-perylenetetracarboxylic bis-benzimidazole.
SC5: 1,3,5-tris-phenyl-2-(4-biphenyl)benzene.
PCBM: [6,6]-phenyl-C61 butyric acid methyl ester.
OPCOT: octaphenyl-cyclooctatetraene.
CBP: 4,4'-N,N-dicarbazole-biphenyl.
$Alq_3$: 8-tris-hydroxyquinoline aluminum.
FPt1: the following platinum(II)(2-4,6-difluorophenyl)pyridinato-N,$C^{2'}$)β-diketonate:

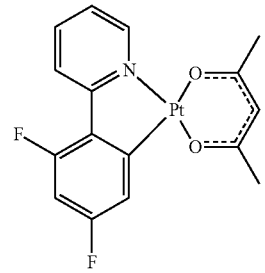

FIrpic: bis(2-(4,6-difluorophenyl)pyridyl-N,C2')iridium(III) picolinate.
α-NPD: 4,4'-bis[N-(1-napthyl)-Nphenyl-amino] biphenyl.
SubPc: Boron subphthalocyanine chloride.
(ppy)$_2$Ir(acac): bis(2-phenylpyridine)iridium(III) acetylacetonate.
HMTPD: 4,4'-bis[N,N'-(3-tolyl)amino]-3,3'-dimethyl biphenyl.
NPD: N,N'-diphenyl-N—N'-di(1-naphthyl)-benzidine.
Tetracene: tetracene.
ZnPc: zinc phthalocyanine
NiPc: nickel phthalocyanine.
CuPc: copper phthalocyanine
ppz$_2$Ir(dpm): Iridium(III) bis(1-phenylpyrazolato,N,C2')(2,2,6,6-tetramethyl-3,5-heptanedionato-O,O).
SnPc: tin phthalocyanine
m-MTDATA: 4,4',4"-tris(3-methylphenylphenylamino) triphenylamine.
fac-Ir(ppz)$_3$: facial tris(1-phenylpyrazolato,N,C2')iridium (III).
PbPc: lead phthalocyanine.
Pentacene: pentacene.
Ru(acac)$_3$: tris(acetylacetonato)ruthenium(III).
fac-Ir(ppy)$_3$: facial tris(2-phenylpyridine)iridium(III).
P3HT: poly(3-hexylthiophene).
fac-Ir(mpp)$_3$: facial tris(3-methyl-2-pheynlpyridine)iridium (III).

The invention is not limited to these materials, and data for many additional materials is readily available in the organic semiconductor literature. In addition, the material bandgaps, HOMOs and LUMOs for some molecules may be tunable by changing substituents.

As is known in the art, the error in measurement of HOMOs and LUMOs can be significant. For example, with current photoelectron spectroscopy and electrochemical measurement, variations in HOMOs can be as high +/−0.1 eV and in LUMOs can be as high as 0.2-0.5 eV, particularly when comparing tests from different labs. Testing accuracy is continually improving. Meanwhile, it is recommended that candidate materials for a cascade arrangement be selected from literature, and then the LUMOs and HOMOs of each of the candidate materials be measured under the same conditions on the same equipment to minimize experimental error.

Within the photoactive regions, each donor layer may be formed of a same material. However, some or all of the donor layers may be formed of different materials. If different materials are used, the donor materials should be arranged so that the HOMO levels are favorable to hole conduction to the anode 120. A donor layer closer (in terms of the conduction path) to the anode 120 should have a HOMO level no more than 3kT lower than an adjacent donor layer further from the anode 120 (k being the Boltzmann constant and T being the operating temperature). More preferably, a donor layer closer to the anode 120 should have a HOMO level equal to or higher than that of an adjacent donor layer further from the anode 120.

Likewise, within the photoactive region, each acceptor layer may be formed of a same material. However, some or all of the acceptor layers may be formed of different materials. If different materials are used, the acceptor materials should be arranged so that the LUMO levels are favorable to electron conduction to the cathode 170. An acceptor layer closer (in terms of the conduction path) to the cathode 170 should have a LUMO level no more than 3kT higher than an adjacent acceptor layer further from the cathode 170. More preferably, an acceptor layer closer to the cathode 170 should have a LUMO level equal to or lower than that of an adjacent acceptor layer further from the cathode 170.

Operating temperatures for organic photosensitive devices are commonly specified as having an operating range of T=−40° C. to +100° C., with a nominal operating temperature approximated as +300° K. Using the nominal operating temperature, 3kT=0.078 eV.

As growth methods for the continuous layers, most any method can be used, including OVJD, OVPD, VTE, OMBD, solution processing, and ink jet printing.

As growth methods for the discontinuous layers, OVJD and OVPD can be used for the deposition of small molecule materials, monomers, oligomers, and dendrimers. Since OVJD and OVPD heat the molecular source, these processes are generally unsuitable for use with polymers that thermally decompose when heated. VTE and OMBD are generally suitable for use with most any organic molecule, including thermally-sensitive polymers. In general, OVJD and OVPD are preferred for growth of the discontinuous layers, since VTE provides less precise control over film-thickness, and since OMBD can be prohibitively expensive.

OVPD is inherently different from the widely used VTE in that OVPD uses a carrier gas to transport vapors into a deposition chamber. Spatially separating the functions of evaporation and transport leads to precise control over the deposition process, and enabling control over the organic surface morphology. Another feature of OVPD, compared with VTE, is the large molecular surface diffusivity and the non-ballistic trajectories followed by the molecules in their arrival at the surface. The short mean free path of OVPD makes it particularly effective at filling preexisting voids and other surface non-uniformities, whereas VTE is ineffective due to the long mean free paths and ballistic trajectories followed by incident molecules.

At typical deposition conditions used in OVPD, the flow of the carrier gas around the substrate creates a hydrodynamic boundary layer where molecular transport is diffusion-limited. The deposition rate, deposition efficiency, and film morphology are controlled by adjusting the organic species concentration, flow hydrodynamics, and surface diffusivity.

OVJD is similar to OVPD (e.g., hot-walled chamber, carrier gas delivery, similar pressures) and both delivery methods can be performed in a same chamber. In general, OVJD provides the highest degree of control. Whereas molecules have fairly random vectors in OVPD, OVJD delivers collimated jets of organic vapor and carrier gas (similar to the directional nature of OMBD, but having a hydrodynamic flow at the deposition surface). For a background discussion of OVJD, see U.S. Patent Application Publication 2004/0048000A1 by Shtein, entitled "Device and Method For Organic Vapor Jet Deposition," incorporated herein by reference. For examples of selective deposition by OVPD and OVJD, see U.S. patent application Ser. No. 11/483,641 by F. Yang et al. filed Jul. 11, 2006 and entitled "Organic Photosensitive Cells Grown On Rough Electrode with Nano-Scale Morphology Control", which is incorporated herein by reference.

Another consideration when choosing the deposition method for the discontinuous layers is the desire to completely fill pockets and voids in the finished device. While VTE and OMBD may be used to form the discontinuous layers, a shortcoming of both VTE and OMBD is the poor ability to completely fill pockets and voids in underlying layers. However, the carrier-gas flow dynamics of both OVPD and OVJD are able to provide excellent coating and coverage of such pockets.

In general, OVPD is less selective than OVJD and is better at filling voids. However, the flow dynamics of OVJD can be modified to promote void filling by inter alia lowering the pressure in the deposition chamber, lowering flow rate of the carrier gas, moving the target away from the nozzles, and increasing the surface temperature of the target. While locally, this makes an OVJD deposition less selective, a high degree of overall selectivity can be retained by controlling over which areas of the target the nozzles are activated.

For donor and acceptor network growth, an equilibrium growth mode can be utilized to promote nanocrystal nucleation on the underlying nanocrystals of the same type. At a slow deposition rate (e.g., 1 Å to 2 Å/sec with OVPD), if there is sufficient energy at the surface of the layers to deter instantaneous nucleation on contact, materials naturally tend to nucleate on existing crystals of a same type. Accordingly, it is possible to get a donor material to self-align on the underlying donor nanocrystals and an acceptor material to self-align on the underlying acceptor nanocrystals between nanocrystal growth steps. Such conditions are easiest to achieve with OVJD and OVPD, where the carrier gas allows for a high degree of surface diffusivity before nucleation.

With VTE and OMBD, a higher substrate temperature plus even slower deposition rate can achieve similar results. With VTE and OMBD, the particular temperatures depend upon the materials. For example, with CuPc, the rate is preferably less than 0.5 Å/s with a substrate temperature higher than room temperature would result in crystalline CuPc with domain sizes larger than 50 Å.

However, in view of the targeted-delivery nature of OVJD and OMDB, faster local growth rates can be used to grow the nanocrystalline networks without relying on such wetting of the growth layer. For example, if relying on targeted (rather than self-aligned) growth, local nanocrystalline growth rates with OVJD may be in the range of 1000 Å/s to 2000 Å/s.

While the material of the discontinuous layers are described as nanocrystals, an individual nanocrystal can nucleate on an underlying crystal to have a same crystalline orientation. Two such nanocrystals may not form distinct domains, with a grain boundary between the crystallites, instead (effectively) becoming a common monocrystal. Nonetheless, as a result of the alternating and overlapping pattern of discontinuous layers, individual nanocrystal can be distinguished by the changes in surface geometry along the conductive pathways.

Material density gradients can be used to promote donor and acceptor network cohesion. For example, donor nanocrystals in discontinuous layers close to the continuous donor layer 152 may have a higher lateral density and/or larger dimensions than donor nanocrystals in discontinuous layers closer to the continuous acceptor layer 154 (not illustrated). Likewise, acceptor nanocrystals in discontinuous layers close to the continuous acceptor layer 154 may have a higher lateral density and/or larger dimensions than acceptor nanocrystals in discontinuous layers closer to the continuous donor layer 152 (not illustrated).

Figure 17:
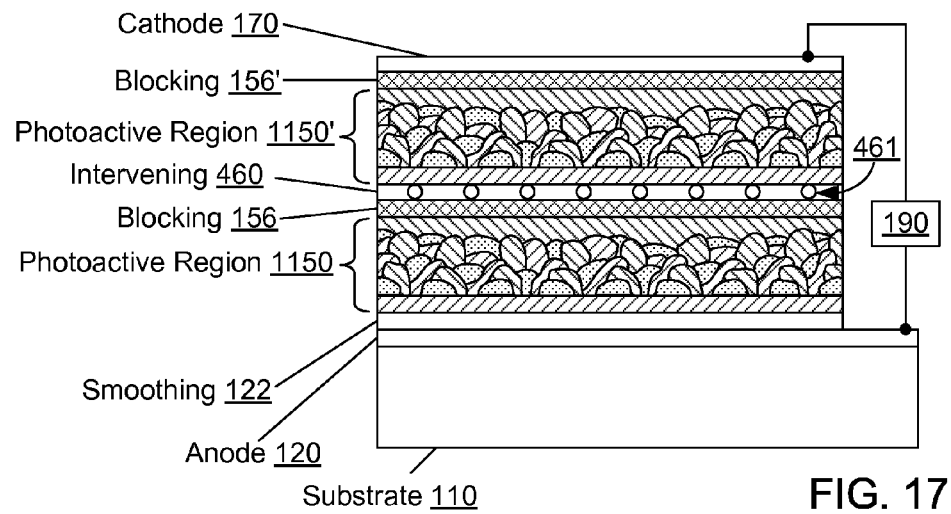
FIG. 17 illustrates two hybrid planar-nanocrystalline bulk heterojunctions arranged in a series tandem configuration.
Figure 18:
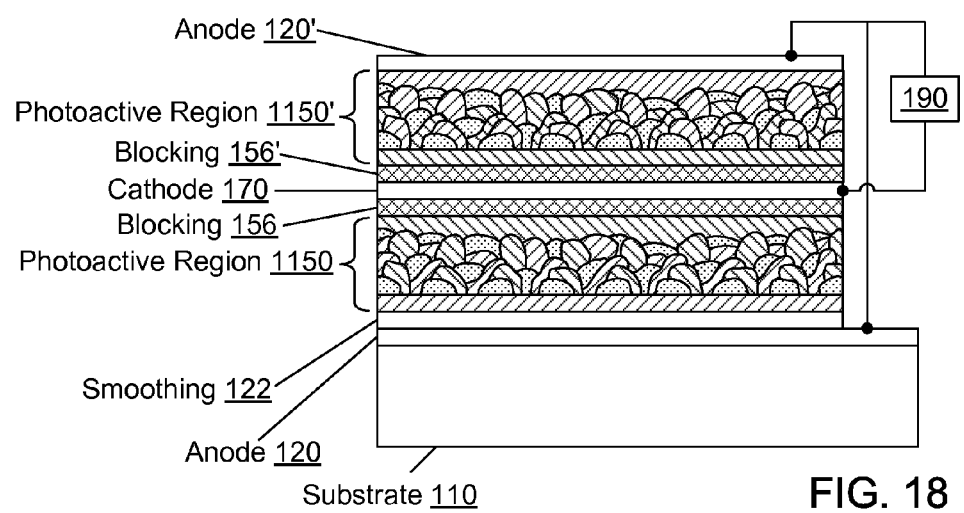
FIG. 18 illustrates two hybrid planar-nanocrystalline bulk heterojunctions arranged in a parallel tandem configuration.

Tandem arrangements like those demonstrated in FIGS. 7 and 8 can also be formed using the new hybrid planar bulk heterojunction structures. For example, FIGS. 17 and 18 demonstrate series and parallel tandem structures using the photoactive region 1150. Any pattern of discontinuous layers can be used for the respective photoactive regions of the tandem designs. Each photoactive region in the tandem device may be the same or different in terms of material pattern and choice of materials. A variety of other tandem arrangements can be utilized as known in the art, as described for example in U.S. Pat. No. 6,352,777 (incorporated above) where insulators are placed between the photoactive regions.

Although anode smoothing layer 122 is shown in the examples, the layer is entirely optional and there is no particular requirement for smoothing prior to depositing the first continuous layer of photoconductive material (donor 152 in the examples). A preferred construction is to omit the smoothing layer 122 and to deposit the first continuous layer of photoconductive material as a conformal layer over a rough bottom electrode material (such as $SnO_2$). For detailed discussion of conformal deposition over a rough electrode, see F. Yang et al., "Organic Solar Cells Using Transparent $SnO_2$—F Anodes," Advanced Materials Vol. 18, Issue 15, pp. 2018-2022 (2006), and U.S. patent application Ser. No. 11/483,642 by F. Yang et al. filed Jul. 11, 2006 and entitled "Organic Photosensitive Cells Grown On Rough Electrode With Nano-Scale Morphology Control," both of which are incorporated herein by reference.

Cost can be reduced by using rough materials for the electrodes/charge transfer layers because rough materials such as $SnO_2$ are less expensive than smoother transparent conductors (such as indium tin oxide). Moreover, by eliminating the smoothing layer 122, the surface area is increased within the photoactive region if a conformal first continuous layer of photoconductive material carries through the underlying surface roughness. Series resistance can be lowered if the conformal layer is made very thin and the smoothing layer is omitted. Preferably, the rough bottom electrode has an exposed surface with a root mean square roughness of at least 30 nm and a height variation of at least 200 nm. "Height variation" refers to the difference between the highest point and the lowest point on the surface of the rough material.

Any number of less-expensive transparent conductive oxides (TCOs) with high surface roughness are available. Examples of other less-expensive rough transparent conductive oxides include ZnO, and $SnO_2$. Preferably, the conductivity of the rough TCO is increased by doping, such as with aluminum-doped ZnO (ZnO:Al), antimony-doped $SnO_2$ ($SnO_2$:Sb), fluorine-doped ZnO (ZnO:F), and gallium-doped ZnO (ZnO:Ga). In addition, as an alternative to TCOs, a transparent rough transparent oxide with exceptional conductivity properties can be formed from carbon nanotubes in a small molecule or polymer matrix. If desired, more expensive rough TCOs may also be used, such as GaO and InGaO.

Although the example structures show a conventional orientation having an anode on the bottom, reverse structures having a cathode on the bottom can also be built. The exciton blocking layer 156 may be omitted, and/or an exciton blocking layer can be included between the donor 152 and the anode 120.

As noted above, the discontinuous sensitizer layers may be made of materials having most any bandgap, including bandgaps narrower than the donor and/or the acceptor, and/or bandgaps wider than the donor and/or acceptor. Including materials with a variety of different bandgaps broadens the absorption spectrum. Unlike conventional small molecular weight or polymeric organic photovoltaic cells, where only conductive or semi-conductive materials are ordinarily allowed, the new photovoltaic cells may include non-conductive dyes such as the Ru-dyes used in dye-sensitized solar cells (DSSC). Such dyes have high absorption coefficient over a broad wavelength range, although they are indeed insulators.

For example, referring to FIG. 16, a CuPc donor and a $C_{60}$ acceptor can be paired with SnPc (absorbing longer wavelengths than CuPc and $C_{60}$) and $Ru(acac)_3$ (absorbing shorter wavelengths than CuPc and $C_{60}$).

EXAMPLES

Figure 19:
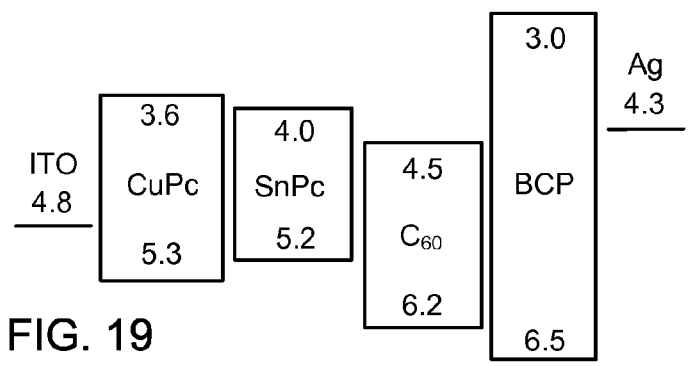
FIG. 19 illustrates an energy level diagram for an example device. The anode is ITO, the donor material is CuPc, the sensitizer is SnPc, the acceptor is $C_{60}$, the blocking layer is BCP, and the cathode is silver.
Figure 20:
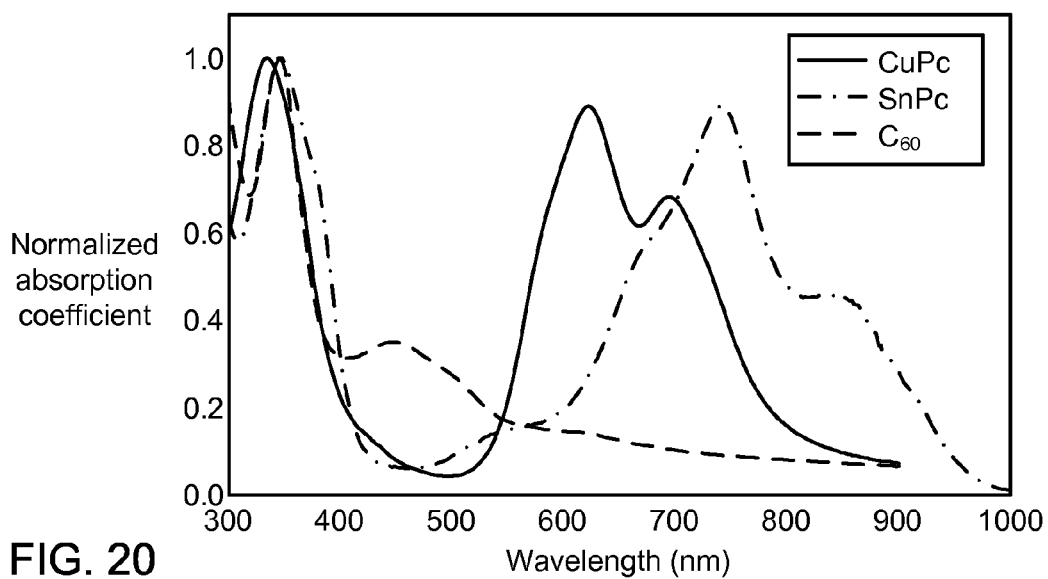
FIG. 20 illustrates the normalized absorption spectra for CuPc, SnPc, and $C_{60}$.
Figure 21:
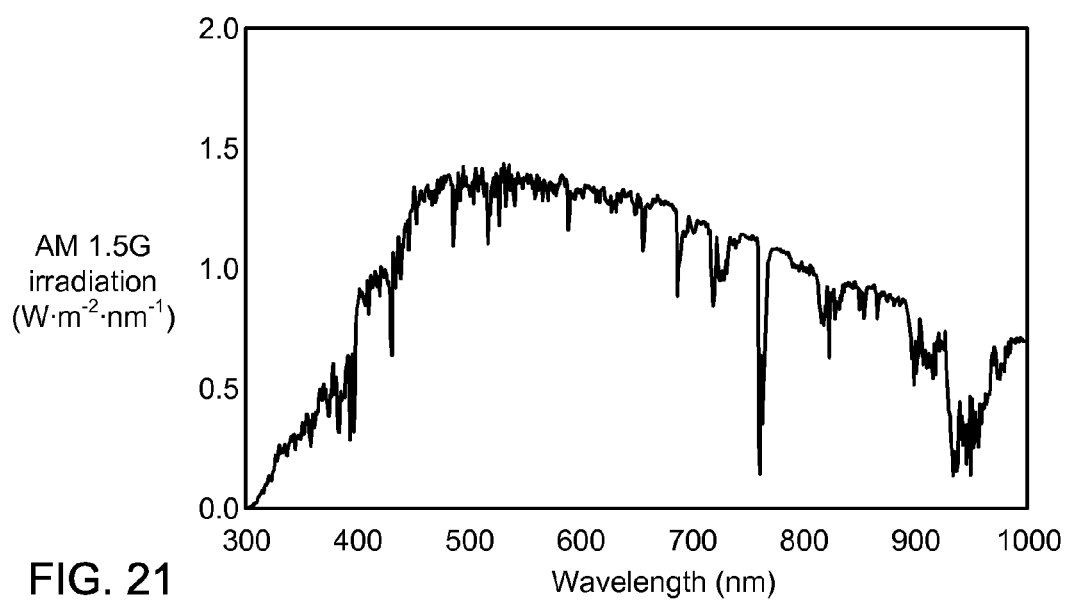
FIG. 21 is an AM 1.5G radiation spectrum (for reference).

Computer simulations were carried for cells having a CuPc donor network, a $C_{60}$ acceptor network, and dispersed SnPc nanocrystals as a sensitizer. The energy level diagram for the design appears in FIG. 19. As an acceptor, $C_{60}$ is highly conductive of electrons. As a donor, CuPc is conductive to holes. As a sensitizer, SnPc is not conductive (it is photoconductive, allowing photogenerated carriers to escape, but is non-conductive as a carrier transport material). As shown in FIG. 20, this combination of materials provides coverage of a larger portion of the AM 1.5G radiation spectra (FIG. 21) than CuPc and $C_{60}$ alone.

Different growth orders and component ratios were tried to change the percolation morphology.

FIG. 22A illustrates a $\{C_{60}/CuPc/SnPc\} \times 4$ structure. The mixing ratio by volume is $C_{60}$:CuPc:SnPc=1:1:1. The bottom continuous layer is CuPc. The top continuous layer is omitted from the figure. FIG. 22B shows the $C_{60}$ network, FIG. 22C shows the CuPc network (including the bottom continuous layer), and FIG. 22D shows the SnPc interspersed in the acceptor and donor networks. In this example, the interspersed SnPc form its own network.

FIG. 23A illustrates a $\{C_{60}/CuPc/SnPc(0.5)\} \times 4$ structure. The mixing ratio by volume is $C_{60}$:CuPc:SnPc=4:4:1. The bottom continuous layer is CuPc. The top continuous layer is omitted from the figure. FIG. 23B shows the $C_{60}$ network, FIG. 23C shows the CuPc network (including the bottom continuous layer), and FIG. 23D shows the SnPc that is interspersed in the acceptor and donor networks. No continuous network of SnPc forms. The overall active layer conduction is largely strengthened relative to the structure in FIG. 22A due to the increased density of percolation pathways in the CuPc and $C_{60}$ nanocrystalline networks.

Figure 24A:
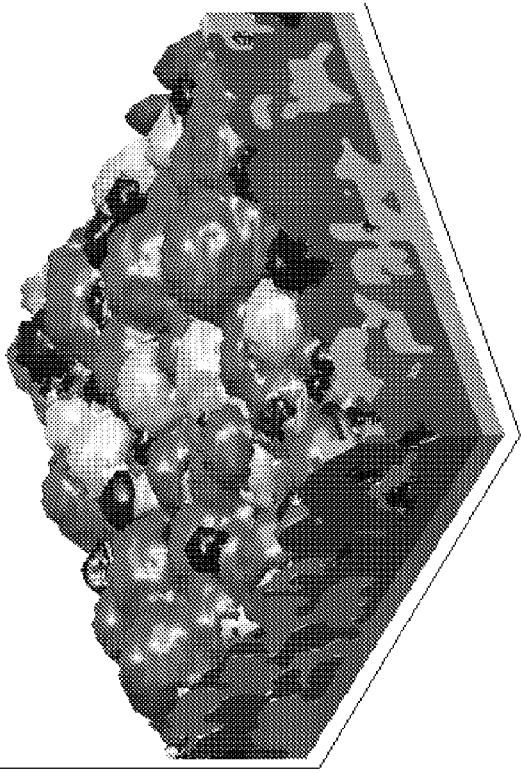
FIG. 24A is a simulated example hybrid planar-nanocrystalline bulk heterojunction structure.
Figure 24D:
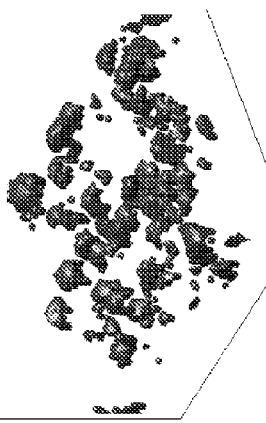
FIGS. 24B to 24D illustrate the constituent components of the structure.
Figure 24C:
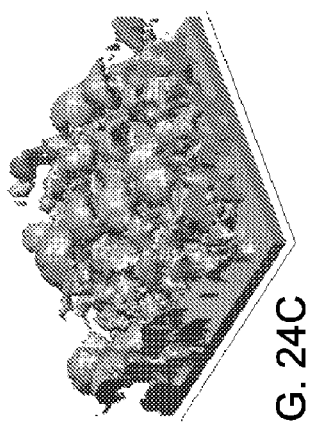
Figure 24B:
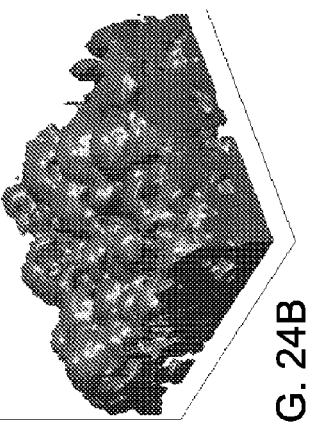

FIG. 24A illustrates a $\{C_{60}/CuPc/C_{60}/SnPc(0.5)\} \times 4$ structure. The mixing ratio by volume is $C_{60}$:CuPc:SnPc=4:4:1. The bottom continuous layer is CuPc. The top continuous layer is omitted from the figure. FIG. 24B shows the $C_{60}$ network, FIG. 24C shows the CuPc network (including the bottom continuous layer), and FIG. 24D shows the SnPc that is interspersed in the acceptor and donor networks. No continuous network of SnPc forms. The increased $C_{60}$ concentration favors a balanced donor/acceptor ratio, further increasing percolation pathways.

In experiments, OVPD was used with a growth rate of 1 Å to 2 Å per second. Rapid shuttering was used to grow the materials one at a time in a nitrogen ambient. Nanocrystals were grown to have average thicknesses of approximately 30 Å and average lateral cross-sections of approximately 100 Å.

While satisfactory results were achieved with 5 cycles composed of 10 layers, where each layer had an average thickness of 30 Å, the results were less satisfactory with 6 cycles composed of 12 layers, where each layer had an average thickness of 15 Å. These results are preliminary, but suggest that the integrity of the carrier collection networks (not unexpectedly) decreases with increasing thickness or more layers. However, with improved deposition techniques, thicker structures may prove viable.

X-ray diffraction and selected-area electron diffraction confirmed the existence of crystalline CuPc and $C_{60}$ in a similar structure to the examples cells, confirming that the networks of nanocrystals are not amorphous.

As described above, organic photosensitive devices of the present invention may be used to generate electrical power from incident electromagnetic radiation (e.g., photovoltaic devices) or may be used to detect incident electromagnetic radiation (e.g., a photodetector or photoconductor cell).

Specific examples of the invention are illustrated and/or described herein. However, it will be appreciated that modifications and variations of the invention are covered by the above teachings and within the purview of the appended claims without departing from the spirit and scope of the invention.

What is claimed is:

1. A photosensitive optoelectronic device, comprising:
    an anode and a cathode;
    a plurality of organic photoconductive materials disposed between the anode and the cathode, including
        a first continuous layer of donor material and a second continuous layer of acceptor material;
        a first network of donor material or materials extending from the first continuous layer toward the second continuous layer, providing continuous pathways for conduction of holes to the first continuous layer, and a second network of acceptor material or materials extending from the second continuous layer toward the first continuous layer, providing continuous pathways for conduction of electrons to the second continuous layer, wherein the first network and the second network are interlaced with each other; and
        at least one other organic photoconductive material interspersed between the interlaced networks, said at least one other organic photoconductive material having an absorption spectra different from the donor and acceptor materials; and
    wherein the plurality of organic photoconductive materials comprises at least one discontinuous layer.

2. The photosensitive optoelectronic device of claim 1, wherein of the first network, the second network, and said at least one other organic photoconductive material interspersed between the interlaced networks each consist essentially of plural crystallites of the respective organic photoconductive material.

3. The photosensitive optoelectronic device of claim 2, wherein each of the crystallites has no dimension greater than 100 nm.

4. The photosensitive optoelectronic device of claim 3, wherein from any point within each crystallite, a distance to an interface boundary with another photoconductive material is no more than 1.5 exciton diffusion lengths of the photoconductive material forming the respective crystallites.

5. The photosensitive optoelectronic device of claim 1, wherein said at least one other organic photoconductive material interspersed between the interlaced networks include an organic photoconductive material having a wider bandgap than the donor and acceptor materials.

6. The photosensitive optoelectronic device of claim 1, wherein said at least one other organic photoconductive material interspersed between the interlaced networks include an organic photoconductive material having a narrower bandgap than the donor and acceptor materials.

7. The photosensitive optoelectronic device of claim 1, wherein said at least one other organic photoconductive material includes a first sensitizer,
    the first sensitizer having a HOMO that is less than a HOMO of the donor material of the first continuous layer and greater than a HOMO of the acceptor material of the second continuous layer; and
    the first sensitizer has a LUMO that is less than a LUMO of the donor material of the first continuous layer and greater than a LUMO of the acceptor material of the second continuous layer.

8. The photosensitive optoelectronic device of claim 7, wherein said first sensitizer comprises SnPc.

9. The photosensitive optoelectronic device of claim 1, wherein said at least one other organic photoconductive material includes a first sensitizer and a second sensitizer, the first sensitizer and the second sensitizer having absorption spectra different from the donor and acceptor materials, and different from each other.

10. The photosensitive optoelectronic device of claim 9, wherein said first sensitizer is TAZ, and said second sensitizer is SnPc, said acceptor material is $C_{60}$, and said donor material is CuPc.

11. The photosensitive optoelectronic device of claim 1, wherein the first continuous layer and the first network are composed of a same donor material.

12. The photosensitive optoelectronic device of claim 1, wherein the second continuous layer and the second network are composed of a same acceptor material.

13. The photosensitive optoelectronic device of claim 1, wherein at least portions of the first network include a donor material different from the donor material of the first continuous layer.

14. The photosensitive optoelectronic device of claim 1, wherein at least portions of the second network include an acceptor material different from the acceptor material of the second continuous layer.

15. The photosensitive optoelectronic device of claim 1, wherein said at least one other organic photoconductive material comprises a plurality of sensitizers interspersed with a repeating pattern between the first continuous layer and the second continuous layer.

16. The photosensitive optoelectronic device of claim 1, further comprising at least one exciton blocking layer arranged between the anode and the first continuous layer, and/or arranged between the cathode and the second continuous layer.

17. The photosensitive optoelectronic device of claim 1, wherein said donor material comprises CuPc.

18. The photosensitive optoelectronic device of claim 1, wherein said acceptor material comprises $C_{60}$.

* * * * *